US012087362B2

(12) United States Patent
Steiner et al.

(10) Patent No.: US 12,087,362 B2
(45) Date of Patent: Sep. 10, 2024

(54) DYNAMIC INTERFERENCE COMPENSATION FOR SOFT DECODING IN NON-VOLATILE MEMORY STORAGE DEVICES

(71) Applicant: Kioxia Corporation, Tokyo (JP)

(72) Inventors: Avi Steiner, Kiriat Motzkin (IL); Kenji Sakurada, Tokyo (JP); Eyal Nitzan, Tel Aviv (IL); Yasuhiko Kurosawa, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 9 days.

(21) Appl. No.: 17/702,359

(22) Filed: Mar. 23, 2022

(65) Prior Publication Data

US 2023/0326526 A1 Oct. 12, 2023

(51) Int. Cl.
*G11C 16/08* (2006.01)
*G11C 16/04* (2006.01)

(52) U.S. Cl.
CPC .......... *G11C 16/08* (2013.01); *G11C 16/0483* (2013.01)

(58) Field of Classification Search
None
See application file for complete search history.

(56) References Cited

U.S. PATENT DOCUMENTS

| 10,607,709 | B1* | 3/2020 | Steiner | G11C 16/0408 |
| 10,614,897 | B1* | 4/2020 | Steiner | G11C 16/0483 |
| 10,963,338 | B1* | 3/2021 | Steiner | G11C 29/50004 |
| 11,024,391 | B1* | 6/2021 | Steiner | G06F 11/1024 |
| 2005/0013165 | A1* | 1/2005 | Ban | G06F 11/1068 |
| | | | | 365/185.2 |
| 2007/0291546 | A1* | 12/2007 | Kamei | G11C 11/5628 |
| | | | | 365/185.17 |
| 2007/0291556 | A1* | 12/2007 | Kamei | G11C 16/0483 |
| | | | | 365/189.09 |
| 2022/0208278 | A1* | 6/2022 | Vu | G11C 11/5642 |

* cited by examiner

*Primary Examiner* — J. H. Hur
(74) *Attorney, Agent, or Firm* — Foley & Lardner LLP

(57) ABSTRACT

Systems, methods, non-transitory computer-readable media for dynamically estimating interference compensation thresholds for read operations in non-volatile memory devices, including determining a plurality of interference states with respect to an interference source of a target row of a non-volatile memory to be read, determining compensation shifts for the plurality of interference states by determining a compensation shift for each of two or more interference states of the plurality of interference states, and applying the compensation shifts for the plurality of interference states to reading the target row.

20 Claims, 23 Drawing Sheets

DYNAMIC INTERFERENCE COMPENSATION FOR SOFT DECODING IN NON-VOLATILE MEMORY STORAGE DEVICES

TECHNICAL FIELD

The present arrangements relate generally to non-volatile memory storage devices, and more particularly to improving endurance and average read performance for non-volatile memory storage devices by mitigating interference of adjacent cells.

BACKGROUND

As the number and types of computing devices continue to expand, so does the demand for memory used by such devices. Memory devices generally include volatile memory (e.g., RAM) and non-volatile memory (e.g., flash memory or NAND-type flash). A non-volatile memory array includes rows and columns (strings) of cells. A cell includes a transistor and stores information for a single bit.

During a read operation, an entire row/page of the non-volatile memory array may be read. This may be done by applying a bias voltage to all rows not being read and a reference threshold voltage to the row that is being read. The bias voltage may allow the transistor of the non-volatile memory array to fully conduct. The cells lying on the row being read will conduct if the threshold voltage is sufficiently high to overcome the trapped charge in the floating gate. A sense amplifier may be connected to each string which measures the current through the string and outputs either a "1" or a "0" depending whether the current passes a certain threshold.

As non-volatile memory cell sizes become smaller, the down-scaling of the memory cell sizes causes an increase in the parasitic capacitance coupling between neighboring cells (floating gate transistors) in a memory block. This phenomenon, called Inter-Cell Interference (ICI), may cause errors in the stored bit, leading to degradation in endurance and read performance for non-volatile memory storage devices.

Non-volatile memory storage devices can implement fast programming methods which induce high levels of interference to neighboring rows during programming because the neighboring rows are less isolated from the target programmed row. In addition, correlated rows may suffer from an increased level of ICI during various stress conditions. For example, the ICI level may increase due to a retention stress on a device, thus causing the optimal read thresholds for ICI compensation to change.

In that regard, there is a long-felt need to adapt to ICI compensation and dynamically match the compensation method to the actual induced interference given a specific stress condition.

SUMMARY

The present arrangements relate to methods for obtaining higher endurance and higher average read performance for non-volatile devices by mitigation of interference of adjacent cells in a soft decoding flow.

In some arrangements a method includes determining a plurality of interference states with respect to an interference source of a target row of a non-volatile memory to be read, determining compensation shifts for the plurality of interference states by determining a compensation shift for each of two or more interference states of the plurality of interference states, and applying the compensation shifts for the plurality of interference states to reading the target row.

In some arrangements, a system includes a non-volatile memory comprising a target row and an interference source of the target row and a circuit configured to determine a plurality of interference states with respect to the interference source of the target row, determine compensation shifts for the plurality of interference states by determining a compensation shift for each of two or more interference states of the plurality of interference states, and apply the compensation shifts for the plurality of interference states to reading the target row.

In some arrangements, at least one non-transitory processor-readable medium containing processor-readable instructions, such that, when executed by one or more processors, causes the one or more processors to determine a plurality of interference states with respect to an interference source of a target row of a non-volatile memory to be read, determine compensation shifts for the plurality of interference states by determining a compensation shift for each of two or more interference states of the plurality of interference states, and apply the compensation shifts for the plurality of interference states to reading the target row.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other aspects and features of the present arrangements will become apparent to those ordinarily skilled in the art upon review of the following description of specific arrangements in conjunction with the accompanying figures, wherein.

DETAILED DESCRIPTION

Figure 1:
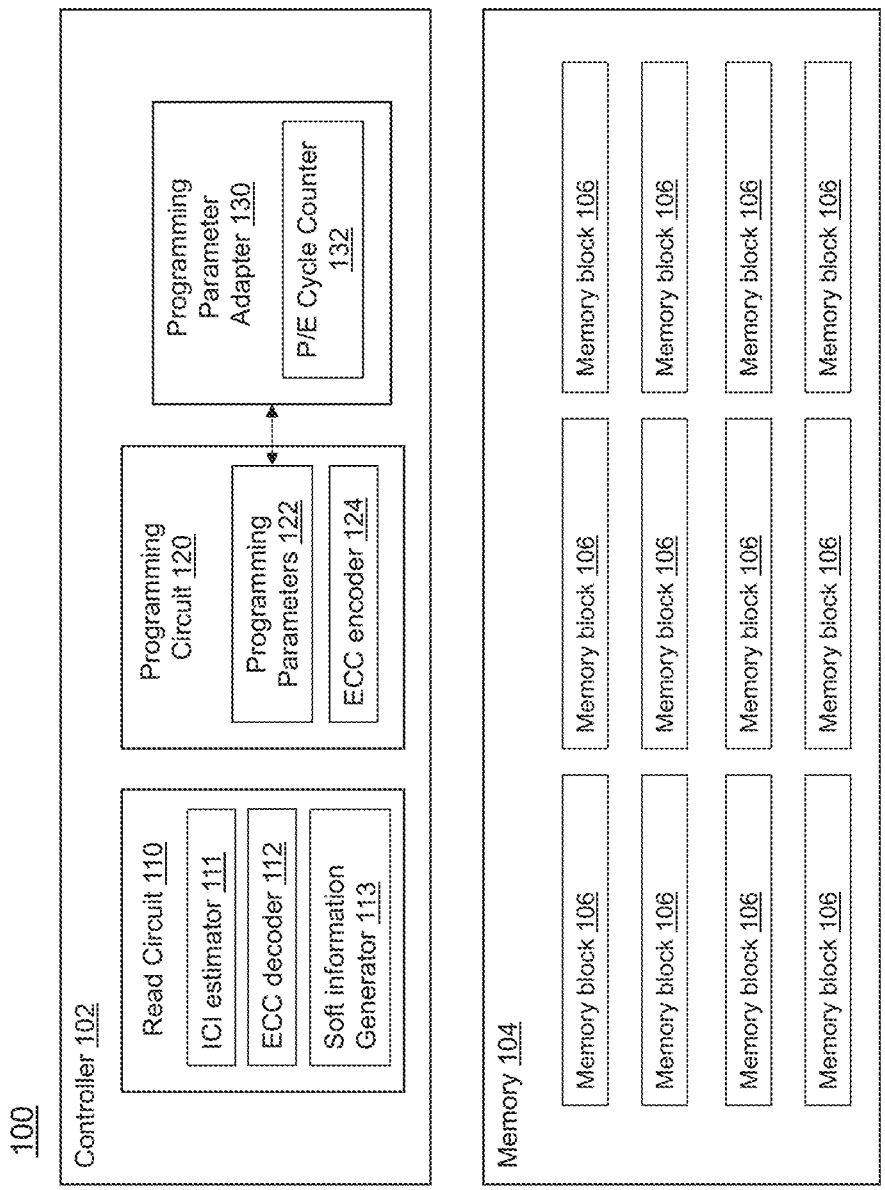
FIG. 1 is a block diagram illustrating a non-volatile storage device according to some arrangements.

Inherent coupling noise between non-volatile memory cells may occur within planar or three-dimensional (3D) non-volatile memory storage devices. In planar non-volatile memory devices, (1) neighboring cells on the same row and (2) neighboring cells on the same column of an adjacent row may be dominant contributors to ICI. Thus, reliability gains for hard/soft inputs can be obtained based on state information of neighboring cells.

The main source of interference may be a programming scheme. For instance, if a row is completely programmed before programming the next row, then the main source of interference may be the programming scheme. For example, during a triple-level cell (TLC) programming, programming of one row may impact a nearby or adjacent row which is already programmed. The cells which are programmed to highest levels may be the source of a stronger interference (than those programmed to levels lower than the highest levels) which may cause unintentional programming of adjacent cells.

However, dense programming non-volatile memory devices (such as NAND storage including quad-level cells (QLC) and five-level cells (PLC)) may include breaking up the programming into multiple steps. For example, the data may be programmed to a given row in a course (initial) setting. Then, the adjacent (correlated) row may be programmed coarsely before the target row is programmed in a fine programing stage to final voltage values. This programming method may require more buffering of data and may have lower programming performance but provides a lower BER programming result with reduced interference between correlated cells.

For example, in 3D TLC NAND devices, ICI coupling may be found on adjacent wordlines. Further, stress conditions such as retention or cross-temperature programming and read may have a different level of interference on a target row in 3D NAND devices (or other non-volatile memory storage devices). Accordingly, by estimating the interference level and an optimal compensation dynamically, ICI can be efficiently decoupled.

Systems and methods are provided for obtaining improved endurance and average read performance for non-volatile memory storage devices by mitigation of interference (i.e., ICI) of adjacent cells within a soft decoding flow. The improved endurance and average read performance may extend the uses of the non-volatile memory storage by increasing device reliability, read performance, and efficiency under all stress conditions. For example, some arrangements relate to estimating ICI compensation for soft decoding in presence of various interference states induced by interference from one or multiple neighboring rows.

In some arrangements, efficient estimation of ICI compensation per state can be obtained by performing shift estimation on only a small number of ICI states and extrapolating the shift for all other states. This allows the estimation process to be more efficient in terms of computation complexity and processing time.

In some arrangements, ICI compensation shift is estimated from soft samples using the histogram of the soft samples per ICI state or for a group of at least one ICI states. In some arrangements, the ICI compensation shift is determined using a weighted average of conditional histogram. In some arrangements, the ICI compensation shift is determined by performing threshold tracking such as minimum search or pre-soft tracking (PST) on a conditional histogram. In some arrangements, the ICI compensation shift is determined by measuring the ratio between the height of a normalized soft samples histogram edge bins and the height of a normalized conditional soft samples histogram edge bins given ICI state. Then, a linear or nonlinear function of the ratios is fitted to estimate the ICI shifts. A simple method for estimating the ICI compensation shift is to use the average of the edge bin height ratios is described with reference to Expressions (13)-(16), below.

In some arrangements, multiple ICI states can be grouped. In some examples, ICI states are ordered according to interference impact. The ICI states grouping may be applied based on the order. In some examples, the order of the ICI states is calculated offline based on statistical data of an average ICI state shift of the maximum point of each lobe or the average ICI state shift of optimal thresholds in database. In some examples, the grouping method is performed offline based on statistical data and using k-means clustering, where the value of k is set based on the trade-off between reducing the number of ICI states and increasing shift estimation accuracy.

In some arrangements, model function hypotheses that represent the ICI compensation shift for each ICI state, on ordered states, and for different stress conditions are prepared offline. The most likely model function is selected according to proximity to available estimated shifts per ICI state. Alternatively, model function parameters are computed from estimated compensation shifts.

In some arrangements, a dynamic ICI compensation is trained for all required stress conditions by generating a database from voltage-threshold (VT) scans on NAND devices under the stress conditions. The database for thresholds estimation is generated for all interference states which are provided in the VT-scans. The database is used for creating hypotheses of a compensation model function. The database can also be used for tuning the compensation estimation algorithm parameters. Examples of the algorithm parameters include the thresholds where neighboring rows are read to generate the database per ICI state.

Soft sampling and decoding may be described in more detail in U.S. application Ser. No. 16/843,774, titled "DECODING SCHEME FOR ERROR CORRECTION CODE STRUCTURE IN DATA STORAGE DEVICES," filed on Apr. 8, 2020 by Avi Steiner and Hanan Weingarten, and U.S. Pat. No. 10,614,897, titled "SYSTEM AND METHOD FOR HIGH PERFORMANCE SEQUENTIAL READ BY DECOUPLING OF INTER-CELL INTERFERENCE FOR NON-VOLATILE MEMORIES," filed on Sep.

13, 2018, by Avi Steiner, which are both incorporated by reference herein in their entireties. The applications incorporated by reference disclose methods for interference compensation. However, as disclosed herein, interference compensation is improved by dynamically estimating a compensation for multiple interference states from multiple interference sources.

In some arrangements, the systems and methods for mitigation of interference of adjacent cells as described in the present disclosure can be implemented on a non-volatile memory storage controller (e.g., the controller 102 in FIG. 1). In some arrangements, the signal processing operations for mitigation of interference of adjacent cells as described in the present disclosure can be implemented by hardware or software running on a non-volatile memory storage controller (e.g., the controller 102 in FIG. 1). Implementing the signal processing operations on the non-volatile memory storage controller hardware (or firmware) may result in low complexity processing. In some arrangements, the signal processing operations for mitigation of interference of adjacent cells as described in the present disclosure can be used for implementation in storage controllers, e.g., solid state drive (SSD) controllers, universal flash storage (UFS) controllers, secure digital (SD) controllers, and the like.

FIG. 1 is a block diagram illustrating a non-volatile storage device 100 according to some arrangements. In some arrangements, the non-volatile storage device may be a flash memory system which can perform any of the methods described in the present disclosure. Examples of the device 100 include but are not limited to, a SSD, a Non-Volatile Dual In-Line Memory Module (NVDIMM), UFS, a SD device, and so on.

In some arrangements, a different device (not shown) may communicate with the device 100 over a suitable wired or wireless communication link to execute some or all of the methods described herein. The device 100 may include a memory module or memory device 104 and a controller 102 for performing operations of the plurality of cells.

The controller 102 may include a read circuit 110, a programming circuit (e.g. a program DSP) 120 and a programming parameter adapter 130. In some arrangements, the read circuit 110 may include an ICI estimator 111, an ECC decoder 112 and/or a soft information generator 113. In some arrangements, the programming circuit 120 may include an ECC encoder 124 and programming parameters 122. In some arrangements, the programming parameter adapter 130 may include a program/erase cycle counter 132. Examples of the controller 102 include but are not limited to, an SSD controller (e.g., a client SSD controller, a datacenter SSD controller, an enterprise SSD controller, and so on), a UFS controller, or an SD controller, and the like. Arrangements of controller 102 can include additional or fewer components such as those shown in FIG. 1.

The controller 102 can combine raw data storage in the plurality of memory blocks 106 such that the memory blocks 106 function as a single storage. The controller 102 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the memory 104 or in any other suitable computer readable storage medium.

The controller 102 includes suitable processing and memory capabilities for executing functions described herein, among other functions. As described, the controller 102 manages various features for the memory block 106 in the memory 104 including, but not limited to, I/O handling, reading, writing/programming, erasing, monitoring, logging, error handling, garbage collection, wear leveling, logical to physical address mapping, data protection (encryption/decryption), and the like.

In some arrangements, the ICI estimator 111 of the read circuit 110 may be configured to estimate an interference state based on a result of a read operation on a first neighboring cell of a first cell (i.e., a target cell) among the plurality of cells. In some arrangements, a statistical dependency modeling of main interference sources and their impact can be characterized. For example, the ICI estimator 111 may be configured to perform a statistical dependency modeling of interference sources and their impact.

In some arrangements, the statistical dependency modeling of main interference sources and their impact can be characterized offline. For example, statistical dependency modeling may be performed offline when different programming schemes of different non-volatile memory storage devices increases the difficulty of performing statistical dependency modeling online. For example, the programming scheme of one generation of non-volatile memory storage devices may be different from that of another generation of non-volatile memory storage devices.

In some arrangements, the ICI estimator 111 may perform a statistical dependency modeling of interference sources and their impact offline. In some arrangements, to perform such statistical dependency modeling offline for a target non-volatile memory storage device (e.g., the memory 104), the ICI estimator 111 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), at least information on the programming scheme of the target non-volatile memory storage device so that it can accurately model the interference sources and their impact in the target non-volatile memory storage device.

In estimating the interference state, the ICI estimator 111 may be further configured to estimate a level at which the first neighboring cell is programmed. For example, the ICI estimator 111 may estimate, based on a result of a read operation on the first neighboring cell, a level at which the first neighboring cell is programmed. The ICI estimator 111 may then estimate an interference state of the first neighboring cell based on the estimated programmed level of the first neighboring cell. In some arrangements, the interference state of a neighboring cell is an estimated programmed level of the neighboring cell.

In estimating the interference state, the ICI estimator 111 may be further configured to obtain the result of the read operation on the first neighboring cell from pre-fetch of a next page read or by saving a previous read result. For example, in estimating the interference state for a target cell in a target page, the ICI estimator 111 may obtain a read result of a neighboring cell (of the target cell) in a next page that is to be read next to the target page, by pre-fetching the read result of the next page. In some arrangements, the ICI estimator 111 may obtain a read result of a neighboring cell (of the target cell) in a previous page that has been read prior to the target page, by saving and reusing the read result of the previous page. In this manner, in some arrangements, the ICI estimator 111 may be configured to estimate interference states for decoding results of read operations on the plurality of cells by reading the rows of the plurality of cells sequentially and only once. In some arrangements, the ICI estimator 111 may estimate the inference state of a neighboring cell from a distribution of state (or level) programmed in the neighboring cell.

In some arrangements, the ICI estimator 111 may analyze and model the interference state for a target cell as a function of one or more cells adjacent to the target cell. In some arrangements, to analyze the contribution of interference of each neighboring cell, a single neighboring row state estimation may be performed. For example, the ICI estimator 111 can estimate the interference state of a neighboring row from a hard read before decoding. In some arrangements, the ICI estimator 111 can estimate the interference state of a neighboring row post decoding as true data.

In some arrangements, once interference sources and their impact are modeled or identified, simple signal processing operations can be performed to compensate for or decouple the interference. For example, sampling results of a target page can be post-processed to compensate for or decouple the interference. In some arrangements, reliability information for reading or decoding of a target page can be provided. For example, the soft information generator 113 of the read circuit 110 may be configured to generate reliability information (e.g., calculating a probability of error) and provide soft information based on the reliability information. In some arrangements, the soft information generator 113 of the read circuit 110 may be configured to generate soft information based on the estimated interference state and a read value from the first cell.

The ECC decoder 112 may be configured to decode soft information as a result of read operations on cells. Additionally or alternatively, the ECC decoder 112 may correct errors, improving accuracy and stress relief of a non-volatile memory storage controller.

The controller 102 may also include a programming circuit 120. The programming circuit may include an ECC encoder 124 and programming parameters 122. For example, the ECC encoder 124 may determine the soft labels from the soft samples. The controller 102 may also include programming parameter adapter 130. The adapter 130 may adapt the programming parameters 122 in the programming circuit 120. The adapter 130 in this example may include a Program/Erase (P/E) cycle counter 132. Although shown separately for ease of illustration, some or all of the adapter 130 may be incorporated in the programming circuit 120.

The memory 104 may be an array of memory blocks 106. The memory blocks may include non-volatile memory such as NAND flash memory, dynamic random access memory (DRAM), magnetic random access memory (MRAM), phase change memory (PCM), ferro-electric RAM (Fe-RAM), and so on. In some arrangements, the memory 104 may have a plurality of cells. In some arrangements, each of the memory blocks 106 may have a plurality of cells. In some arrangements, the cell memory (e.g., the memory 104 or a memory block 106) may include rows and columns of the plurality of cells. In some arrangements, a memory block 106 may include a plurality of pages (not shown) and a page may be defined as cells linked with the same wordline, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell. Additionally or alternatively, the memory 104 can comprise or be implemented using a plurality of dies, each of the dies containing a plurality of the blocks 106.

Figure 2:
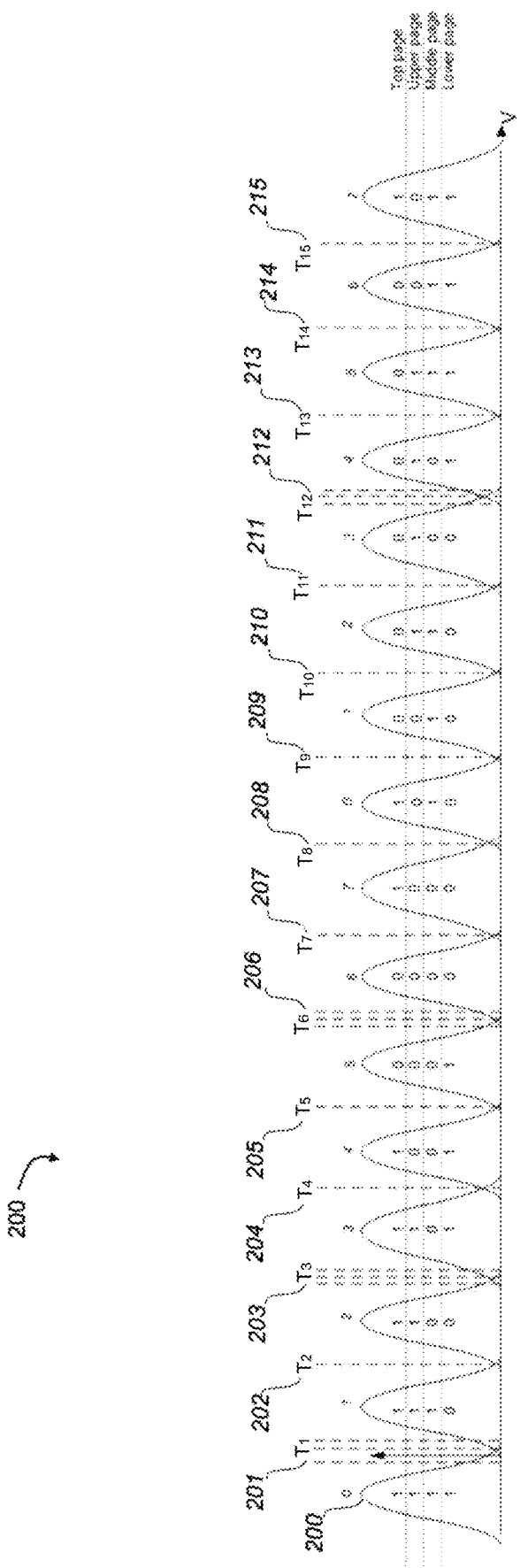
FIG. 2 is a diagram of histograms with VT distributions of a four bits per cell (bpc) non-volatile memory storage device, according to some arrangements.

FIG. 2 is a diagram of histograms 200 with VT distributions of a four bits per cell (bpc) non-volatile memory storage device (e.g., a flash memory device such as a QLC with 16 programmable states), according to some arrangements. Depicted are 16 lobes (distributions, or histograms) corresponding to the 16 different bit combinations of four bits represented by the charge state of the cell. A lower page read requires using thresholds $T_1$ 201, $T_3$ 203, $T_6$ 206, and $T_{12}$ 212 to separate the histograms into those with LSBs of 0 into those of LSBs of 1. Read thresholds $T_2$ 202, $T_8$ 208, $T_{11}$ 211, and $T_{13}$ 213 are used to separate the histograms into those with LSBs of 0 and those with LSBs of 1 for reading middle pages. Read thresholds $T_4$ 204, $T_{10}$ 210, and $T_{14}$ 214 are used to separate the histograms into those with LSBs of 0 and those with LSBs of 1 for reading upper pages. Read thresholds $T_5$ 205, $T_7$ 207, $T_9$ 209 and $T_{15}$ 215 are used to separate the histograms into those with LSBs of 0 and those with LSBs of 1 for reading top pages. The lower histogram 200 (e.g., the lowest lobe (0)) is the erase level.

As described herein, when read operations are performed on a target row, interference may be induced. Conventionally, a fixed ICI compensation may be added to read thresholds. However, the fixed compensation may not be effective in improving BER because depending on the ICI state, stress condition of the device, and the read threshold, the degree of the added ICI compensation varies. For example, while the average effect of an induced ICI state may be known (e.g., shifting the threshold higher or lower than the ideal/optimum ICI compensation threshold associated with no ICI state threshold), the degree of the shift in the direction may be unknown. In addition, the degree of the shift may depend on the stress condition.

Figure 3:
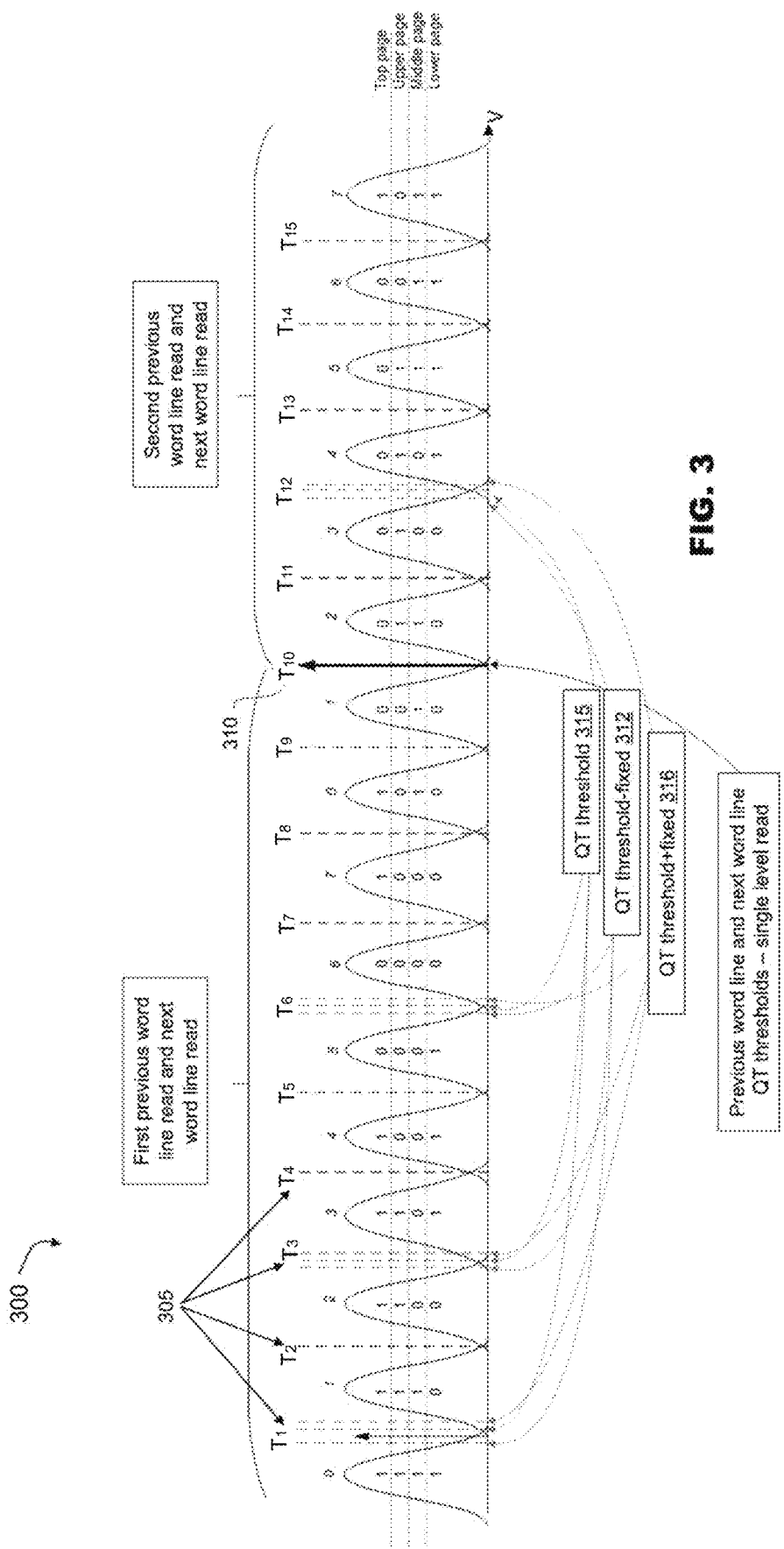
FIG. 3 is a diagram of histograms with VT distributions for each programmed state (e.g., four ICI states) of a non-volatile memory storage device, according to some arrangements.

FIG. 3 is a diagram 300 of histograms with VT distributions for each programmed state (e.g., four ICI states) of an example row (e.g., a QLC NAND row) of a non-volatile memory storage device, according to some arrangements. The row indicated in FIG. 3 may be the target row to be read. As shown, a single read of the neighboring n interfering rows is performed, where there are n rows for which a single read is applied at threshold $T_{10}$ 310. There may be a second induced histograms for the same target row. The VT distribution has two reads from two rows, e.g., WL(n−1) and WL(n+1). The left side of the diagram 300 shows VT distributions for a first previous wordline read, e.g., $$Sm(1)=WL(n-1) \qquad (1);$$

and next wordline read, e.g., $$Sp(1)=WL(n+1) \qquad (2).$$

The right side of the diagram 300 shows VT distributions for a second previous wordline read, e.g., $$Sm(2)=WL(n-1) \qquad (3);$$

and next wordline read, e.g., $$Sp(2)=WL(n+1) \qquad (4).$$

A single read of the ICI information from each row is created, thus creating a total of four ICI states.

The dashed lines in FIG. 3 (e.g., thresholds 305) denote optimal read thresholds based on which minimal output BER per threshold when no ICI information is available. In other words, the dashed lines in FIG. 3 correspond to ideal read thresholds without ICI information. Thresholds 312 and 316 may be offset from threshold 315. For example, thresholds 312 and 316 may be a value offset of thresholds 315 based on a fixed step size of a digital-to-analog converter (DAC). For example, thresholds 312 are quick training (QT) thresholds minus X(i)DAC. Thresholds 316 are QT thresholds plus Y(i)DAC.

In some arrangements, dynamic estimation can be performed based on actual stress condition, given that various stress conditions may have different interference levels induced on the target row. Examples of dynamic estimation can be found in U.S. application Ser. No. 17/407,096, titled "SYSTEM AND METHOD FOR DYNAMIC COMPENSATION FOR MULTIPLE INTERFERENCE SOURCES IN NON-VOLATILE MEMORY STORAGE DEVICES," filed on Aug. 19, 2021 by Avi Steiner, Hanan Weingarten, and Yasuhiko Kurosawa, which is incorporated by reference herein in its entirety. The decision to perform ICI compensation according to stress condition estimation can be dynamically made. In some examples, this may be characterized offline, and there is no single shift value for compensation which will provide the optimal ICI compensation given the interference information. Therefore, dynamic estimation of the read thresholds is performed. With a single read of $T_{10}$ 310 on WL(n−1) and on WL(n+1), 4 induced ICI states result. In some examples, only 3 states are defined, group or Cluster 1: $(L_p, H_m)$, $(L_m, H_p)$, Cluster 2: $(L_p, L_m)$, and Cluster 3: $(H_m, H_p)$. In Cluster 1, thresholds are not estimated but previous thresholds estimation in this target row, if available, are used. If not available, thresholds for Cluster 1 are estimated without ICI information, which is usually done earlier in the read-flow stage. For Cluster 2 and Cluster 3, corresponding histograms are computed for a linear estimator or a Deep Neural Network (DNN) estimator, from which the required compensation shifts are obtained.

Figure 4:
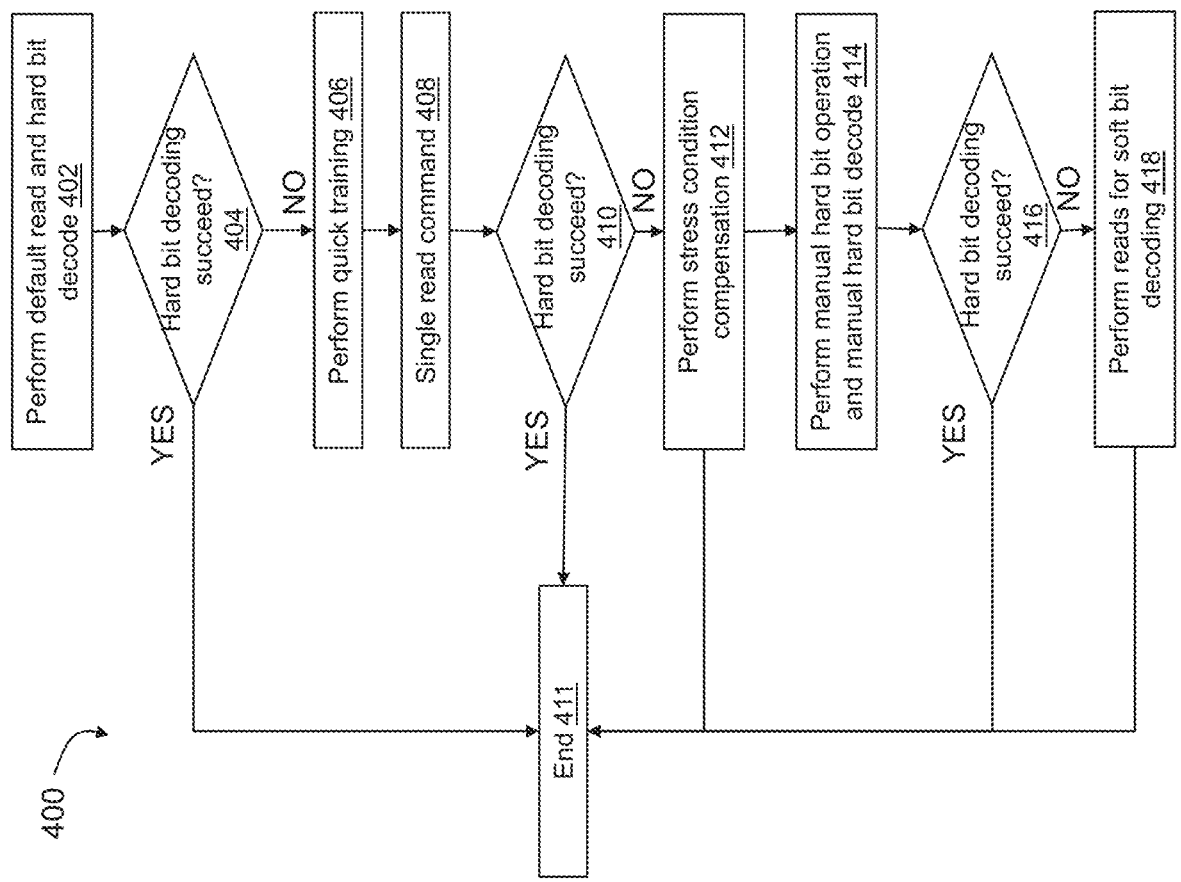
FIG. 4 is a flowchart of a read flow using stress condition classification to perform dynamic ICI compensation with adapted read thresholds to a target page under the current stress conditions, according to some arrangements.

FIG. 4 is a flowchart of a read flow 400 using stress condition classification to perform dynamic ICI compensation with adapted read thresholds to a target page under the current stress conditions, according to some arrangements. As described herein, the benefits of using dynamic threshold estimation and dynamic stress class estimation include reducing the BER and reducing the probability of having to perform soft decoding. Further, performing stress condition estimation adds a minimal amount of reads.

In 402, a single read command may be performed on a target row. The read type may be a full page read. The read command may be performed with default thresholds for the target row as usually performed when minimal (or no) prior information is available on the target page/block. If prior information is available, the first read thresholds may be based on history and/or tracking information instead of the default values. For example, the read thresholds may be the read thresholds associated with the previous read command. In some arrangements, the read command may use the last threshold if the time associated with the read command is less than 70 microseconds. In some arrangements, a hard decoding attempt may be performed on the read results.

In 404, it may be determined whether the hard decoding of the read result of the target page succeeded. If the hard decoding failed (e.g., due to high error rate), the process may proceed to 406. For example, the decoded BER may not satisfy a threshold (e.g., an accuracy threshold). If the hard decoding succeeded, the process may end at 411.

Over time, the hard decoding may be more likely to succeed (and therefore proceed to the end at 411) because the default thresholds (or the previous thresholds) track the stress condition and/or other changes to the non-volatile memory storage device. Stress conditions may dynamically change according to temperature and/or time. However, in some cases, the temperature may change slowly such that the stress condition and associated compensated threshold may track, resulting in a desirable BER.

For example, at time t=0, the hard decoding may fail and the ICI compensation thresholds may be adjusted as described herein. At time t=1, the hard decoding may likely succeed because the adjusted thresholds determined from the first execution of 402-418 may still be relevant/updated at time t=1. Accordingly, the quality of service may improve based on the self adjusting process of the non-volatile memory storage device. The probability of soft decoding decreases (e.g., the probability of reaching 418) because the previously updated thresholds track the conditions of the non-volatile memory storage device such that hard bit decoding is more likely to succeed more often. Updating the thresholds such that hard bit decoding is more likely to succeed (e.g., at 404, 410, and 416) frees the processing power and resources of the non-volatile memory storage device. Accordingly, the overall latency resulting from performing reads is decreased because the first read (e.g., performed at 402) and associated read thresholds are likely relevant at a later time.

In 406, QT may be performed. The QT operation may perform a set of read operations (e.g., five single level cell (SLC) reads) using mock thresholds. Histograms may be computed to estimate the read thresholds for the next read. The reads performed with the mock thresholds may be saved on the buffers so that they be used later on in read flow.

The computed histogram may also be used for the estimation of stress conditions. Before dynamic ICI compensation is performed, a classification of the stress condition may be performed. An ICI compensation without dynamic estimation of stress conditions may have a non-negligible impact on latency tail distributions and therefore may be avoided. Determining the stress condition may improve the distribution of computing resources because the tradeoff between determining a dynamic ICI compensation given certain stress conditions and the improvement of the BER may not be beneficial given the costs (e.g., time, computational resources, and the like) of performing the ICI compensation. In some instances, performing ICI compensation may decrease the BER. For example, as discussed herein, dense programming non-volatile memory storage devices (e.g., QLC devices) may employ incremental programming such that there is less programming interference (but there may still be interference due to retention, for example). Accordingly, it may not be efficient to apply interference compensation thresholds and the interference compensation thresholds may lead to increased BER. In other cases, dynamic ICI compensation may be dependent on the classified stress condition. Detecting the stress condition may be performed during a first tracking operation in the read flow. No additional overhead may be implemented when detecting the stress condition.

For example, when performing a conditional ICI operation, classifying and identifying a stress condition (e.g., retention stress and cross-temperature stress) may dictate the need for dynamic ICI compensation based on the stress condition. The dynamic ICI compensation follows a stress condition estimation that is performed during QT, where the stress condition estimation result is used to decide whether to apply ICI compensation before decoding.

The stress condition may be classified using classifiers such as support vector machines and/or neural networks. For example, various support vector machines (SVM) may use information from the computed histograms to classify stress conditions. For example, input information may include the interference state of the target row, a feature and a corresponding stress condition. The feature may be information obtained during a read operation of the target row (e.g., physical row number, program/erase cycle count, no-ICI commonly estimated thresholds (e.g., no-inter cell interference thresholds)).

In some arrangements, there may be one SVM per stress condition (e.g., one vs all classification). Each SVM may make a binary determination as to whether the histogram data input into the SVM corresponds to the particular stress class associated with the SVM.

The input histogram data may be transformed into a higher dimension (e.g., mapping the data to a new dimension, employing the "kernel trick" using sigmoid kernels, polynomial kernels, radial basis function kernels, and the like) such that the data is linearly separable. A decision boundary may be determined based on the dimension of the input data. The decision boundary may learn to separate the inputs into different classes by optimizing the decision boundary. The decision boundary may be optimized by taking the gradient of a cost function (such as the hinge loss function) to maximize the margin of the decision boundary with respect to the SVM class. The SVM may be trained using each histogram data and stress condition data such that the decision boundary is tuned over time. Arrangements of employing a neural network are described herein.

If a relevant stress condition is identified (e.g., retention stress and/or cross-temperature stress as identified by the SVM or neural network), then performing dynamic ICI compensation given the multiple sources of interferences may be beneficial (e.g., decrease the BER, reduce the probability of soft decoding). Performing dynamic ICI compensation may include reducing the number of ICI states to an effective number of ICI states and averaging an ICI compensation shift for the effective ICI states. If a relevant stress condition is not identified (e.g., a relevant stress condition is not associated with the target row), then fixed ICI compensation (or no ICI compensation) may be applied to the target row. For example, a fixed ICI compensation may be selected from a predetermined table based on a computed histogram, a mock read, a read operation, or the like. Additionally or alternatively, soft decoding may be performed on the target row.

Figure 5:
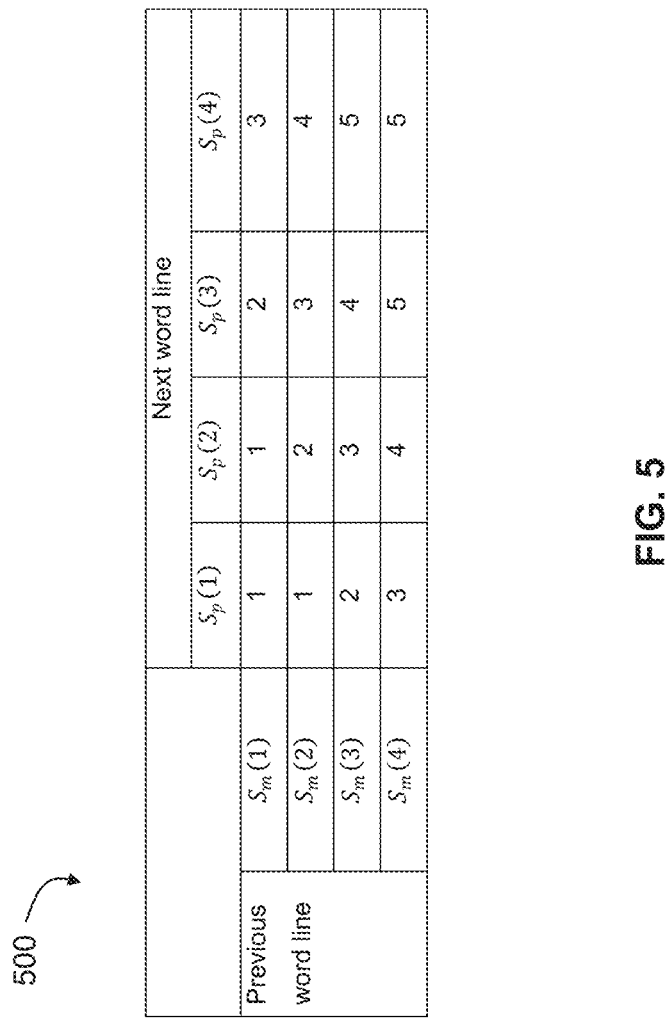
FIG. 5 shows an example of clustering the ICI state pairs into groups to improve the ICI compensation threshold shift estimation, according to some arrangements.

A dynamic ICI compensation threshold may be estimated for each of the k-ICI state clusters using mock reads and associated histograms, as discussed herein. Clustering the states (as described in the example of FIG. 5) beneficially reduces the number of effective states for a mock threshold estimation. FIG. 5 shows an example 500 of clustering the ICI state pairs into groups to improve the ICI compensation threshold shift estimation, according to some arrangements. Clustering the ICI state pairs reduces the number of states into an effective number of states. As shown, the ICI states may be clustered into five clusters, where each of the five clusters are almost equal in size. Accordingly, the number of ICI states is reduced from 16 states to effectively five states, facilitating a more robust compensation threshold estimation.

ICI states may be clustered (or otherwise associated) using sequential clustering algorithms such as k-means clustering. Each cluster of ICI states (e.g., an effective ICI state) may represent a collection of ICI states that are similar. ICI states may be grouped based on a similarity determination involving the distances of ICI states from a centroid. For instance, a centroid may be randomly generated. Each cluster of ICI states associated with k centroids may be determined to be a kth ICI effective state. ICI states may be clustered based on a relative distance between the ICI states (determined using histogram data) and the centroid. The centroid may be moved to a new relative location based on minimizing the average distance of each of the ICI states associated with the centroid. Each time the centroid moves, the distances between the centroid and the ICI states may be recalculated. The centroid may be moved iteratively closer to ICI states until a stopping criteria is met (e.g., ICI states do not change clusters, the sum of the distances is minimized, a maximum number of iterations is reached). In some configurations, the distances between the ICI states and the centroid may be determined using Euclidean distance. In other configurations, the distances between the ICI states and the centroids may be based on a similarity of correlated features of the ICI state (e.g., features of the histogram resulting in an ICI state).

Additionally or alternatively, each ICI state may be determined to be a centroid. For example, ICI states may be clustered based on the distances of the centroid ICI state to other ICI states. Distance measures may include, for example, the smallest maximum distance to other ICI states, the smallest average distance to other ICI states, and the smallest sum of squares distances to other ICI states. The clustered ICI states may be similar such that each of the clustered ICI states have a similar average shift from a no-ICI state. Accordingly, ICI compensation may be determined from a grouped/clustered state.

Additionally or alternatively, ICI states may be clustered based on similar effects induced on a target row. For example, there may be a case in which a single read operation is performed on a previous wordline and on a next wordline. Accordingly, there may be four states, $L_p$, $L_m$, $H_p$, $H_m$. L denotes "low state" and H denotes "high state." Each of the states may be associated with the next wordline (p) and previous wordline (m). The four states may be clustered into three states as shown below:

| Cluster 1 | ($L_p$, $H_m$) ($L_m$, $H_p$) |
| Cluster 2 | ($L_p$, $L_m$) |
| Cluster 3 | ($H_m$, $H_p$) |

In the example, the states may be clustered based on high (H) and low (L) interference. For example, Cluster 1 may be determined based on whether the target row has an interference source from the next wordline, which is high, and an interference source associated with the previous wordline which was low (or the interference source from the next wordline was high and the interference source associated with the previous wordline was low). The shift on the target row (e.g., from H to L or L to H) is the same. Accordingly, the two states may be merged into a single cluster.

Cluster 2 may be created based on merging the ICI shift based on the interference source from a previous wordline and the next wordline being low. Similarly, Cluster 3 may be created based on merging the ICI shift based on the interference source from the previous wordline and the next wordline being high. Accordingly, the number of ICI states may be reduced.

In an example, 16 states of interference may result from four ICI states induced from three reads of a next wordline and three reads of a previous wordline. Similar ICI states may be grouped/clustered into a smaller set of ICI states to reduce the number of ICI states to an effective number of ICI states.

After the ICI states of different relevant rows (e.g., neighboring rows) have been clustered and the number of ICI states have effectively been reduced, mock reads may be performed on the target row. Performing the mock read may include using a fixed (or predetermined) set of mock thresholds to read the target row. The mock read may be a read with predefined thresholds which are reads only for sensing the histogram distribution of the target row.

The mock-read threshold can be used to facilitate the estimation of the optimal compensation for each histogram, as described herein. The selection of the mock-read thresholds may be optimized according to one or more of the following criteria: (1) minimizing the read-flow overhead while meeting the reliability specification. Accordingly, the minimal set of required mock thresholds (or a reduced set of mock thresholds) to compute a histogram with ICI information may be selected; (2) minimize the Minimum Mean Square Error (MMSE) of added BER due to the ICI compensation; (3) minimize the tail distribution of the added BER over all of the stress conditions (e.g., a weighted MMSE).

In some arrangements, a fixed ordering of multiple ICI states may be performed to replace the clustered ICI states and the compensation shift per ICI state. Modeling the ICI compensation as a function may avoid information loss that may occur when ICI states are clustered. Accordingly, a model function with parameters/coefficients may be used to determine the compensation per ICI state. Replacing the clustered ICI states with a model function may be performed if a fixed static ordering exists for the ICI states. For example, during both program disturb stress and retention stress conditions, the impact of interference may be consistent with ICI state orders.

A model function may be optimized to parametrically describe the ICI compensation shift as a function of the ICI states given multiple ICI states. The non-uniform grid mapping for the ICI states may be optimized offline. For example, an n-th degree polynomial may describe the compensation shift function, where, the compensation shift function may be modeled as shown in Expression (5):

$$f(x_i) = a_0 + a_1 x_i + a_2 x_i^2 + \ldots a_n x_i^n \quad (5),$$

where $i=1, \ldots, k$ for k-ICI states, $x_i$ is the x-axis grid value for the i-th ICI state, and $a_0, \ldots, a_n$ are the polynomial coefficients. The coefficients may be dynamically estimated per threshold, per row, and/or per stress condition.

In some arrangements, the coefficients describing the optimal ICI compensation function may be estimated, per threshold, using a DNN. Arrangements of employing a deep-neural network will be described with reference to FIG. 9.

The ICI state may be represented on the x-axis (e.g., using a non-linear grid mapping) and the threshold shift may be represented on the y-axis. For example, given a graphical representation describing the relationship between the clustered ICI states and the ICI compensation threshold shift, two parameters of the graphical representation may be an accurate mechanism of determining the threshold shift. Additionally or alternatively, the relationship between the clustered ICI states and the ICI compensation threshold shift may be indicated by an nth degree polynomial.

Modeling the relationship between the clustered ICI states and the ICI compensation threshold shift reduces the number of reads. In an example, three ICI reads may be performed on the next wordline, and three ICI reads may be performed on the previous wordline, resulting in a total of four ICI states per wordline resulting in 16 total ICI states. Conventionally, an estimated ICI compensation threshold may be determined for each ICI state. However, given a limited length codeword, and having to estimate each of the thresholds for 16 states, the resources (time, computational processing powers, etc.) are effectively reduced for each of the states. That is, computing the thresholds for each state reduces the resources available for estimating a different state and/or completing other estimations/tasks using the resources such that the accuracy of estimating each state may be reduced.

Accordingly, the ICI compensation shift may be described relative to zero shift of different thresholds. That is, ICI compensation may be the shift responding to optimal thresholds such as ideal thresholds, for no ICI. The ICI compensation shift may be described as a function of the ICI state because when there is retention, for example, the ICI compensation increases as a function of the duration or retention of the stress impact. As described herein, the relationship of the ICI compensation shift and the ICI state may be determined by estimating, using a linear estimator and/or a nonlinear estimator, at least two parameters of a linear curve or n-parameters of an nth degree polynomial.

In 408, a single read command may be performed using the estimated thresholds from 406. The reads may be saved on buffers so they may be used later on in the read flow. Hard bit decoding may be attempted of the read result on the target page. In some examples, 410 may be similar to 404. In 410, it may be determined whether the hard decoding of the read result of the target page succeeded. If the hard decoding failed, the process may proceed to 412. If the hard decoding succeeded, the process may end at 411.

In 412, a single read operation on the next wordline row and a single read operation on the previous wordline row (or any other main interference row) may be performed. If the stress conditions determined from 406 do not indicate a retention condition and/or a cross temperature stress condition, then it may not be beneficial to dynamically compensate the ICI states based on the stress condition and the process may proceed to soft decoding (e.g., FIG. 15 or FIG. 16). If the stress conditions determined from 406 indicate a retention stress and/or a cross temperature stress, then a histogram with ICI states and mock reads may be computed to determine the dynamic ICI shift thresholds per ICI state. A shift may be determined using a DAC converter for each ICI threshold using the single reads determined in 402, the effective ICI states determined in 406, and the histogram determined in 406.

The thresholds for cluster 1 (including the states ($L_p$, $H_m$) ($L_m$, $H_p$)) may be previously estimated from a target row (if the previously estimated thresholds are available). Otherwise, the thresholds for cluster 1 may be the thresholds without ICI information.

To compute the DAC shift thresholds associated with the ICI states of cluster 2 and 3, a linear estimator or a DNN may be used. Arrangements of employing a neural network will be described with reference to FIG. 9.

The estimated read thresholds for each interference state may be computed using the set of M mock thresholds jointly with multiple reads of the ICI information which is combined into k-ICI states. For example, the estimated read thresholds per ICI state may be given by Expression (6):

$$\hat{V}_{KD} = X_{KD \times K(M+1)} \cdot H_{K(M+1) \times 1} \quad (6),$$

where $\hat{V}$ is a KD×1 vector containing estimation results for D thresholds of D+1 possible programmed states, and for K ICI states. In the case of a TLC device, D=7 and there may be two sets of seven thresholds where each threshold corresponds to an ICI state. In the case of a QLC device, D=15 may be the number of estimated thresholds. In Expression (6), the histogram vector of K(M+1) may reflect the histogram size. For example, when M mock read thresholds are used, there are M+/histograms, multiplied by k-ICI states.

In 414, a manual hard bits operation may be performed. The manual hard bit operation may include applying a compensation offset value as a function of the stress condition clusters (e.g., clusters 2 and 3 determined in 406) per threshold. Two additional full reads may be performed using the fixed shift of thresholds. A single input hard bit codeword may be formed by choosing the parts according to ICI state information from the read results. In some arrangements, a hard decoding attempt may be performed on the read results.

In some examples, 416 may be similar to 404 and 410. In 416, it may be determined whether the hard decoding of the read result of the target page succeeded. If the hard decoding failed, the process may proceed to 418. If the hard decoding succeeded, the process may end at 411.

In 418, two additional full page read (or other reads) may be performed to obtain soft bit information such that soft bit decoding may be performed (e.g., using the soft information generator 113 of FIG. 1). For example, two read operations may be performed and two ICI states may be compensated using fixed shifts relative to the estimated thresholds from 406. If the stress conditions were identified as including retention and/or cross temperature, then the soft bit information may be combined with the read information from 414 to provide labels for the decoder (e.g., the ECC decoder 112 in FIG. 1). If the stress conditions were identified as not including retention and/or cross temperature, then the soft bit information may be combined with the read information from 408.

Figure 6:
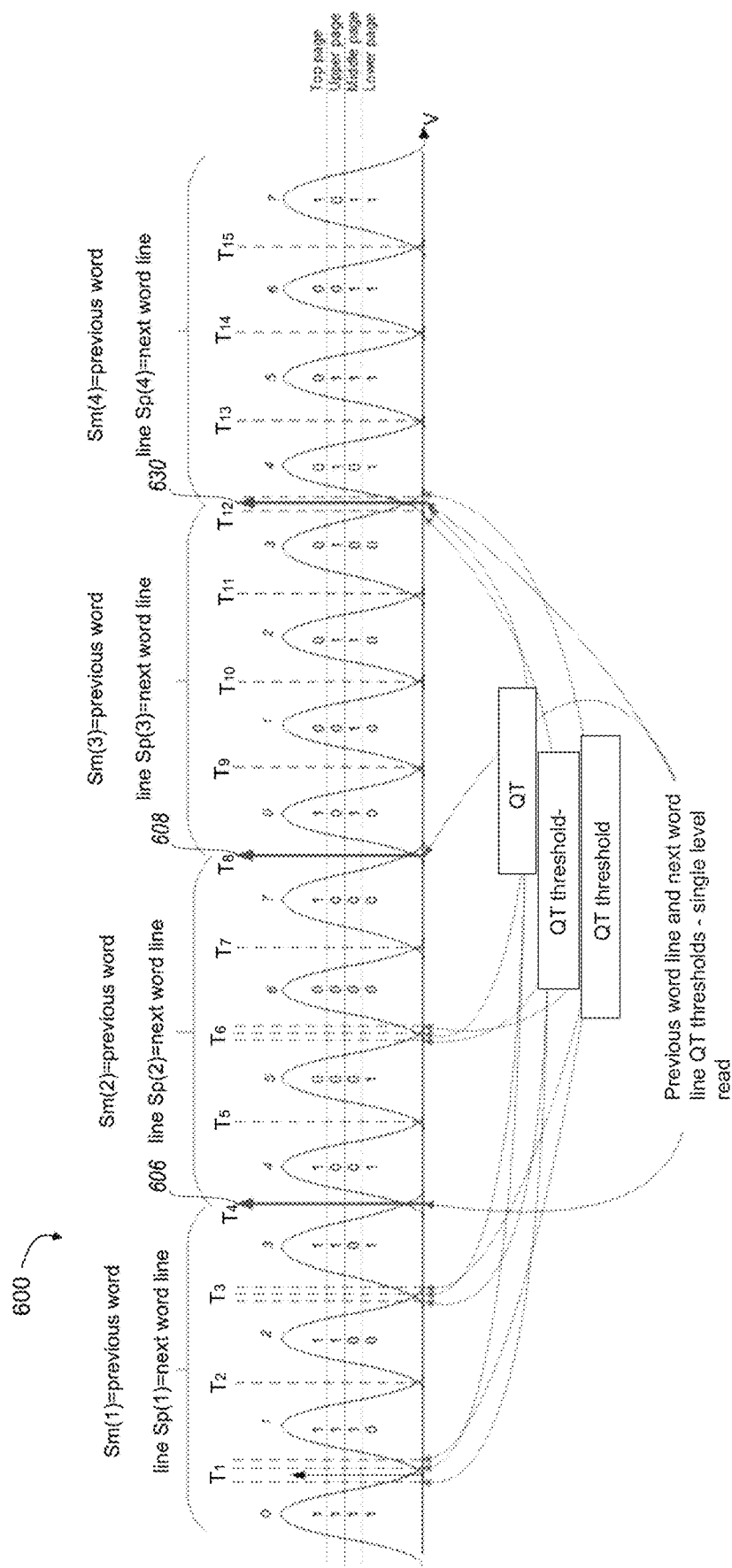
FIG. 6 is a diagram of multiple read operations being performed on a histogram with VT distributions of a non-volatile memory storage device for obtaining 16 ICI states, according to some arrangements.

As described, in a soft decoding flow, performing multiple reads of interference rows can obtain high resolution interference information. This allows ICI dynamic compensation to be performed per ICI state. Multiple reads induce many ICI states. As described, the ICI states can be clustered into a small number of groups with similar interference impact. A single ICI compensation shift can be estimated for each group. FIG. 6 is a diagram of multiple read operations being performed on a histogram with VT distributions of a four bpc non-volatile memory storage device (e.g., a flash memory device such as QLC with 16 programmable states), according to some arrangements. As shown, six single state reads from two different rows (e.g., three reads from each row) are used to obtain ICI information. ICI3 is implemented using thresholds $T_4$ 606, $T_8$ 608, and $T_{12}$ 630 to read ICI information from the next row or wordline WL(n+1) and the previous row or wordline WL(n−1), where $S_m(i)$, i=1, . . . , 4 and $S_p(i)$, i=1, . . . , 4 indicate the information obtained from the reads. In other words, the reads map interfering cells of WL(n−1) into groups Sm(1), . . . , Sm(4) and those of WL(n+1) into groups Sp(1), . . . , Sp(4). Every pair ($S_m(i)$, $S_p(i)$) is an ICI state for i, j=1, . . . , 4. The 16 ICI states may induce compensation thresholds for estimation, which may end up in inaccurate estimations using a limited size row information. As shown, each of the ICI state pairs ($S_m(i)$, $S_p(i)$) is clustered into groups to improve the ICI compensation threshold shift estimation. Accordingly, five effective states are created from the total of six reads, which allows robust compensation thresholds estimation.

As described, estimating the device read thresholds for each effective ICI state can be determined using Expression (6). In the example set forth in FIG. 6, K is 5 in Expression (6) as there are 5 ICI states. D=15 for the example set forth in FIG. 6, and M=15 if 4 page reads are done using 15 mock thresholds. $\hat{V}$ is a KD×1 vector containing estimation results for D thresholds of D+1 programmed states, and for K effective ICI states. Histogram vector of K(M+1) reflects the histogram size. When M mock read-thresholds are used, there are M+1 histogram bins, which are multiplied by the K effective ICI states.

Figure 7:
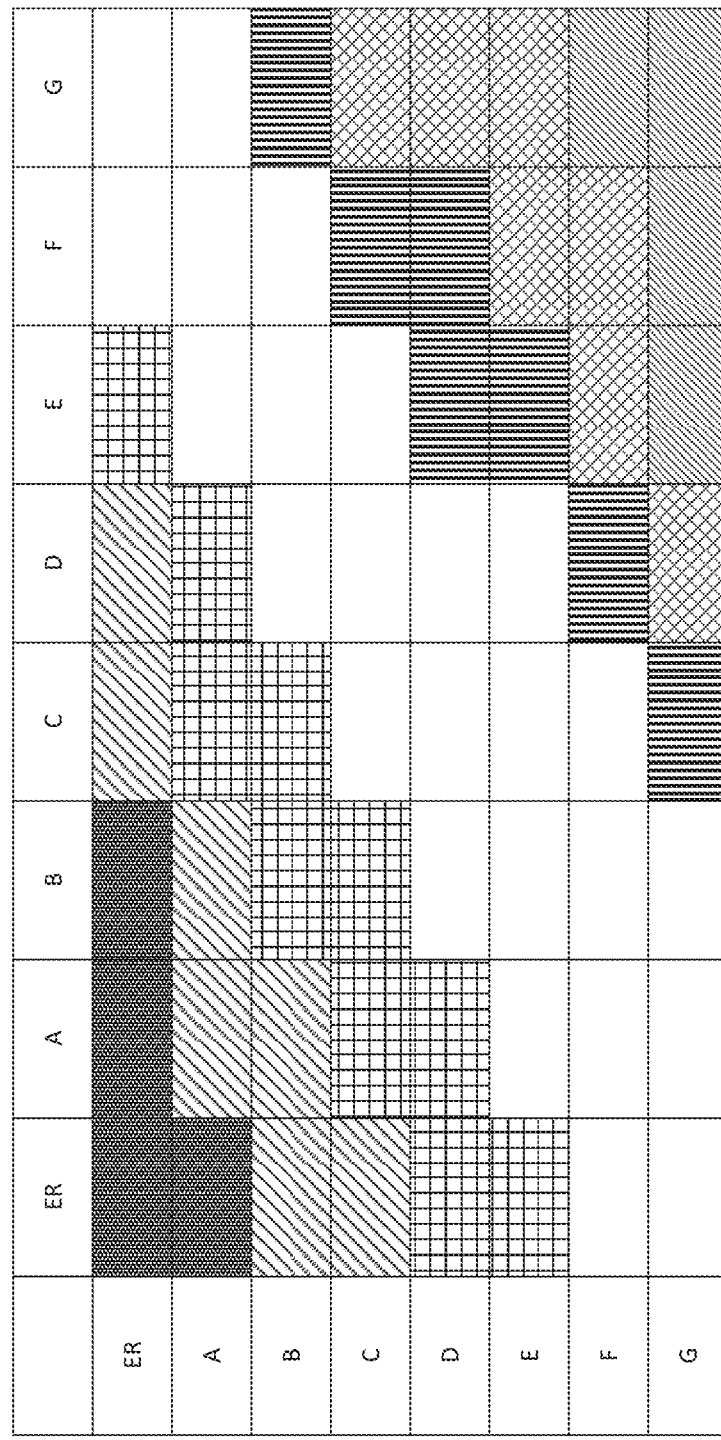
FIG. 7 is a schematic diagram illustrating a clustering for 64 ICI states of a TLC device originating from all page TLC reads of two neighbouring rows which contribute interference, according to various arrangements.

Another higher resolution ICI state grouping example is shown in FIG. 7. FIG. 7 is a schematic diagram illustrating a clustering for 64 ICI states of a TLC device originating from all page TLC reads of two neighbouring rows which contribute interference, according to various arrangements. The results are determined by reading the pages of each neighbouring row (e.g., next row, WL(n+1) and previous row, WL(n−1)). The results include a 6-bit description of the ICI state. Similar states are clustered into same ICI state. As shown, the 64 states are compressed into 8 distinct states that can be represented by three bits in binary. Each of the 8 distinct states is shown in a different shading.

Figure 8:
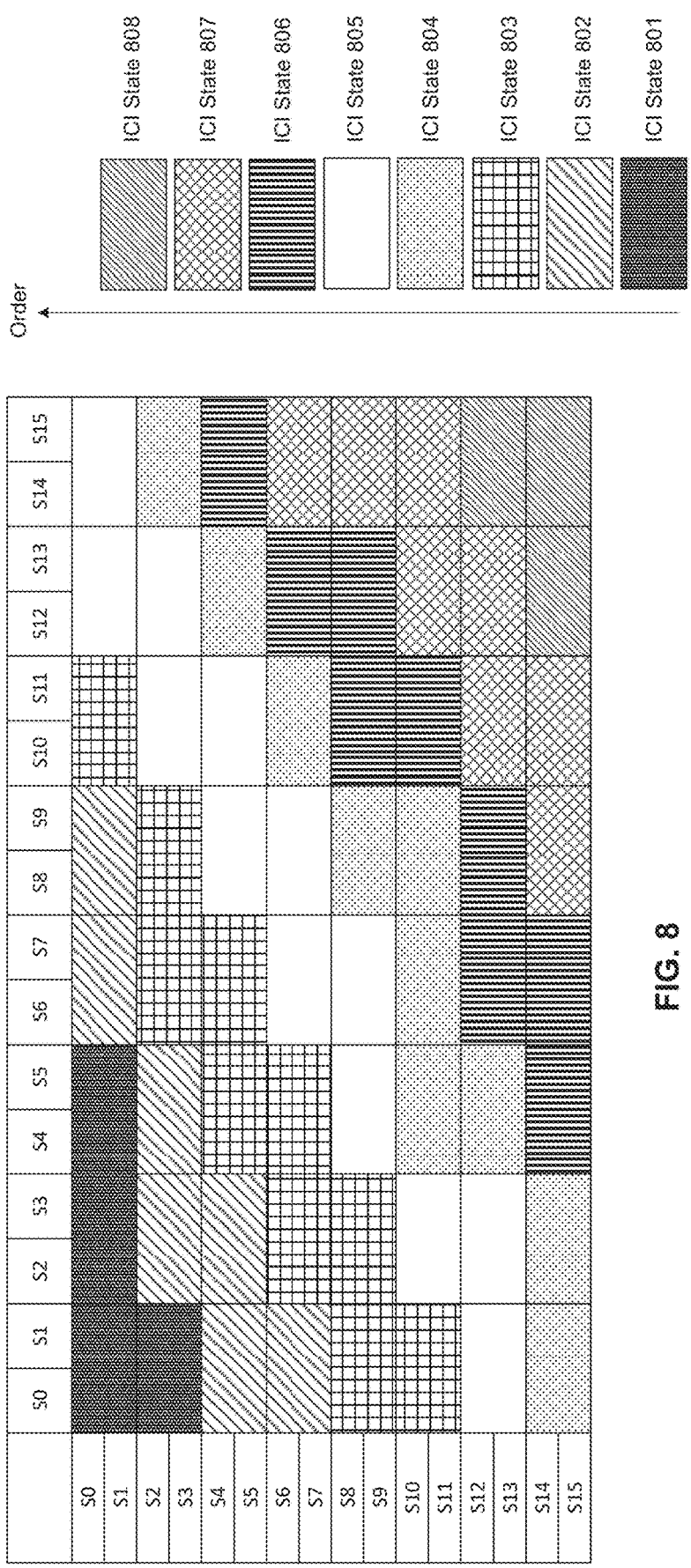
FIG. 8 is a schematic diagram illustrating a clustering for 64 ICI states of a QLC device originating from all page QLC reads of two neighbouring rows which contribute interference, according to various arrangements.

Another higher resolution ICI state grouping example is shown in FIG. 8. FIG. 8 is a schematic diagram illustrating a clustering for 64 ICI states of a QLC device originating from all page TLC reads of two neighbouring rows which contribute interference, according to various arrangements. The reading of the two rows of the QLC device is performed using the thresholds $T_0$, $T_2$, $T_4$ 606, $T_6$, $T_{10}$ 608, $T_{10}$, $T_{12}$ 630, and $T_{14}$ shown in FIG. 6. Four page reads are performed in the next row, WL(n+1), and four page reads are performed in the previous row, WL(n−1). The read result is clustered into three bits using eight groups. Generally, the combining of different states into same group or cluster is determined by offline optimization over a large database. The clustering uses a typical ICI shift computed for each ICI state. The states that have closest average shift can be combined into a single cluster. The smaller the variation of average shifts between ICI states, the fewer number of groups are needed. For example, a K-means clustering algorithm can be implemented offline to perform the grouping task.

Figure 9:
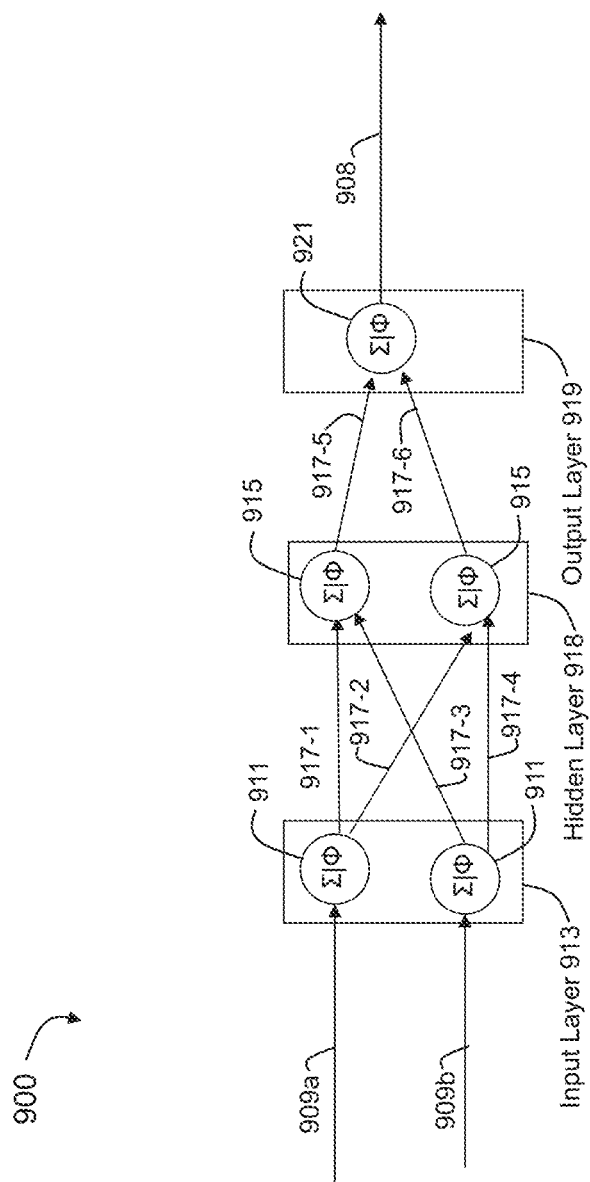
FIG. 9 is a block diagram of a multi-layer perceptron network, according to some arrangements.

FIG. 9 is a block diagram of a Multi-Layer Perceptron (MLP) network 900, according to some arrangements. The network 900 can be implemented as a DNN to determine the estimated read thresholds $\hat{V}_{KD}$ as an alternative to Expression (6). As shown, the network 900 is a fully connected network. The network 900 may be implemented within the non-volatile storage device 100. For example, the network 900 may be implemented within the controller itself, as a firmware software implementation running via an embedded CPU or as a hardware implementation, depending on the firmware memory and latency performance specifications. In other examples, the network 900 can be implemented using hardware outside of the non-volatile storage device 100. The network 900 is configured to accurately estimate thresholds using mock reads and ICI read results.

The neural network model 900 may include a stack of distinct layers (vertically oriented) that transform a variable number of inputs 909a and 909b (collectively 909) being ingested by an input layer 913 into an output 908 at the output layer 919. The network 900 may be trained on a training dataset including features, mock and ICI based histogram vectors, and a corresponding read threshold, stress condition and/or polynomial coefficient. For example, interference states of the target row, features and a corresponding read threshold, stress condition and/or polynomial coefficient may be used in a training dataset. Optimal ICI thresholds are used in the training examples as labels.

As discussed herein, the network 900 may be used to estimate dynamic ICI compensation thresholds, stress conditions, and/or polynomial coefficients using one or more of mock reads, ICI read results and additional features and an input layer 913 and one or more hidden layers 918. In other arrangements, the network 900 may not include any hidden layers 918. The inputs 909 may be received by the input layer 913 as a vector.

In some arrangements, the network 900 may be a chain of neural networks such that the stress condition, polynomial coefficients and/or threshold to dynamically compensate ICI may be estimated. The architecture of the networks trained to estimate the various outputs 908 (e.g., ICI compensation thresholds, stress conditions, and/or polynomial coefficients) may each be different. For example, the architecture of the networks may have a different number of hidden layers 918 or a different model (e.g., random forests, SVM). Additionally or alternatively, the architecture of the networks may be the same (e.g., same number of hidden layers, same type of network (convolutional neural network)).

The mock reads (or histograms from the soft samples) and one or more ICI read inputs 909 to the network 900 may be a computed histogram vector from the mock reads and ICI reads. The feature inputs 909 may include a stress classification score (e.g., received from a different network employed to determine a stress classification), physical row number, program/erase cycle count, no-ICI commonly estimated thresholds, ICI state index after being ordered, and other information obtained during a read operation. Some features, like no ICI commonly estimated thresholds may depend on the read flow implementation. In some arrangements, the read with ICI information may follow a threshold tracking state that acquires thresholds without ICI for the target row.

Using feature data in addition to histogram vector information (e.g., from the mock and ICI reads) allows the network 900 to learn, and benefit from, the interplay between the features of the cell. For example, training the network 900 to predict/estimate the compensated ICI thresholds with feature data may result in improved estimated compensated ICI threshold. For example, the feature information may convey information about the environment of the cell (e.g., stress conditions) that allows the network 900 to better learn the relationship between the estimated compensated ICI thresholds (output 908) and the mock read and ICI read inputs 909.

The input layer 913 includes neurons 911 connecting to each of the neurons 915 of the hidden layer 918. The neurons 915 in the hidden layer 918 connect to neuron 921 in the output layer 919. Depending on what the network 900 is trained to do, the output layer 919 may generate a vector 908 indicating the estimated read thresholds (e.g., the ICI compensation thresholds) if the network is being employed to estimate the ICI compensation threshold. The network 900 may also be trained to generate an output vector 908 of polynomial coefficients if the network is employed to estimate polynomial coefficients.

Additionally or alternatively, the output layer 919 may be a softmax classifier using a softmax function (e.g., a normalized exponential function) to transform an input of real numbers into a normalized probability distribution over predicted output classes. That is, if the network 900 is employed to determine a stress classification, the output layer 919 may generate a score for each stress condition such that the highest score corresponds to the most likely estimated stress condition. The network 900 may include a number of hidden layers 918 between the input 913 and the output layer 919.

Generally, neurons (911, 915, and 921) perform particular computations and are interconnected to neurons of adjacent layers. Each of the neurons 911, 915 and 921 sum the values from the adjacent neurons and apply an activation function, allowing the network 900 to learn non-linear patterns. The network uses the non-linear patterns to learn non-linear relationships between the inputs (e.g., information associated with the, features, mock reads and ICI read results) and the output (e.g., the estimated ICI compensated threshold, stress conditions, polynomial coefficients, or the like).

Each of the neurons 911, 915 and 921 are interconnected by algorithmic weights 917-1, 917-2, 917-3, 917-4, 917-5, 917-6 (collectively referred to as weights 917). Weights 917 are tuned during training to adjust the strength of the neurons. The adjustment of the strength of the neuron facilitates the network 900 ability to learn non-linear relationships. The algorithmic weights are optimized during training such that the network 900 learns estimated compensation thresholds. The network 900 may be trained using supervised learning.

In some arrangements, each ICI state or a group of two or more ICI states can be ordered (e.g., a fixed ordering) to replace grouping and compensation shift estimation for each ICI state or ICI group/cluster that use estimation of a model function parameters or coefficients. In some arrangements, the ordering can be performed in the situation in which a fixed static ordering of ICI states exists. Applicant recognizes that for both program disturb stress and retention stress conditions, the impact of interference is consistent with the order of ICI states. An example of the order for ICI states for eight ICI states is shown in FIG. 8. Representative ICI states 801, 802, 803, 804, 805, 806, 807, and 808 in that order, correspond to the lowest interference shift to the highest interference shift. In other arrangements, the ICI states can be ordered from the largest negative interference shift, smallest negative interference shift, smallest positive interference shift, and largest positive interference shift.

In some arrangements, an optimized ordered mapping for multiple ICI states can be determined offline. The compensation shift can be estimated for each of those multiple ICI states from the soft sampling histogram. In an example, a histogram vector of soft samples obtained from N read operations around a given threshold, denoted by $h_{N \times 1}$. For the same threshold, the conditional histogram for a given k-th ICI state is denoted as $h_{N \times 1}^{k}$. The shift relative to the hard decision threshold for each histogram bin $V_{1 \times N}$ can be determined using the following vector:

$$v_{1 \times N} = \left[ -\frac{N}{2} + \frac{1}{2}, -\frac{N}{2} + 1\frac{1}{2}, \ldots, \frac{N}{2} - \frac{1}{2} \right]. \quad (7)$$

The average bias shift of the soft samples can be computed by Expression (8):

$$\text{bias} = \frac{v_{1 \times N} \cdot h_{N \times 1}}{\sum h_{N \times 1}}. \quad (8)$$

In case of Multi-Level Cell (MLC) (e.g., TLC or QLC) devices, a histogram around a specific threshold may have very high values on edge bins (e.g., the two bins on the opposite edges). In that case the bias and other shift estimates can be computed without considering the edge bins (e.g., edge bins reduction), for example, using the following vector:

$$v_{1 \times (N-2)} = \left[ -\frac{N}{2} + 1\frac{1}{2}, -\frac{N}{2} + 2\frac{1}{2} \ldots, \frac{N}{2} - 1\frac{1}{2} \right]. \quad (9)$$

Similarly, the histogram without the edge bins is denoted by $h_{(N-2)\times1}$. The bias is computed by Expression (10):

$$\text{bias} = \frac{v_{1\times(N-2)} \cdot h_{(N-2)\times1}}{\sum h_{(N-2)\times1}}. \tag{10}$$

Next, the shift for ICI compensation $I_k$, which is associated with every ICI state, is determined for the k-th state using Expression (11):

$$I_k = \frac{v_{1\times N} \cdot h_{N\times1}^k}{\sum h_{N\times1}^k} - \text{bias}. \tag{11}$$

Removing the edge bins, the shift for ICI compensation $I_k$ can be determined using Expression (12):

$$I_k = \frac{v_{1\times(N-2)} \cdot h_{(N-2)\times1}^k}{\sum h_{(N-2)\times1}^k} - \text{bias}. \tag{12}$$

Figure 10:
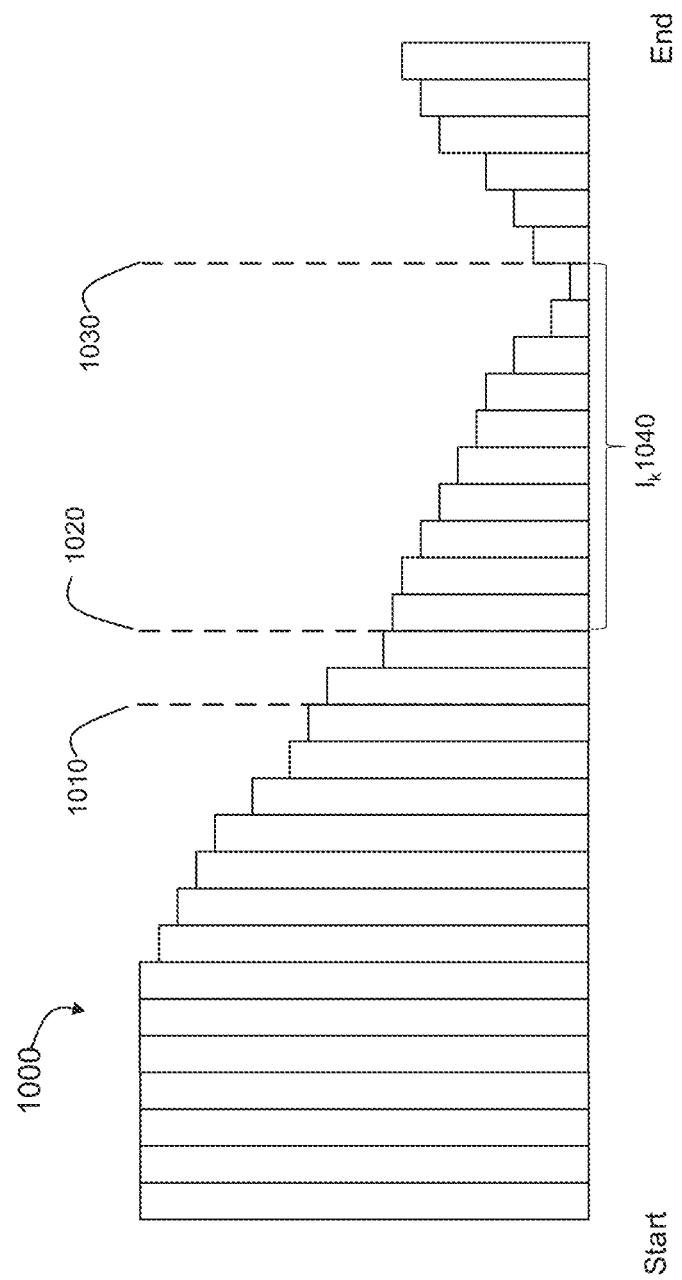
FIG. 10 is a conditional histogram of k-th ICI state, according to various arrangements.
Figure 11A:
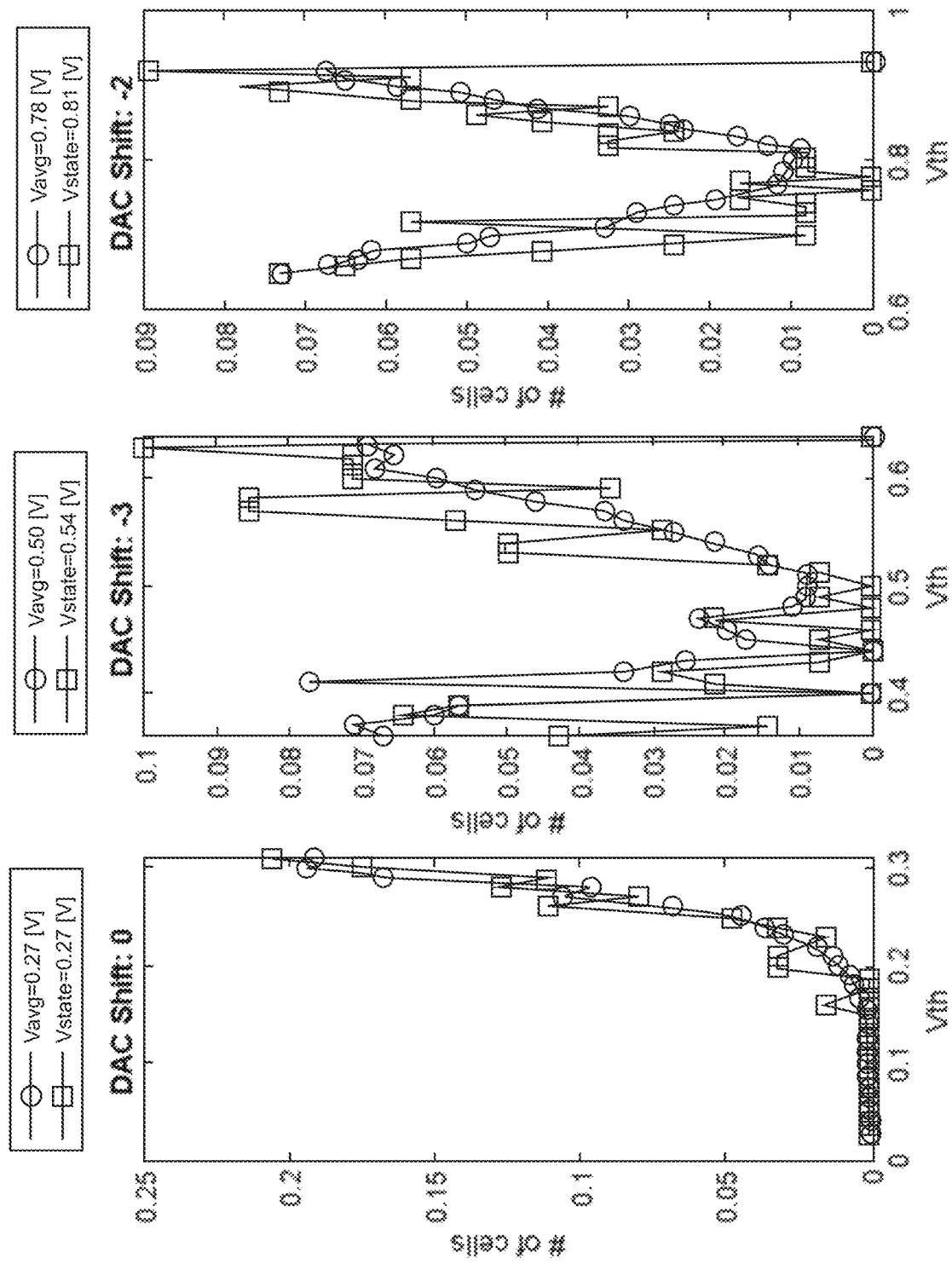
FIGS. 11A, 11B, 11C, 11D, and 11E are diagrams illustrating conditional histograms for all 15 thresholds of a QLC device and for the k-th ICI state, according to various arrangements.
Figure 11B:
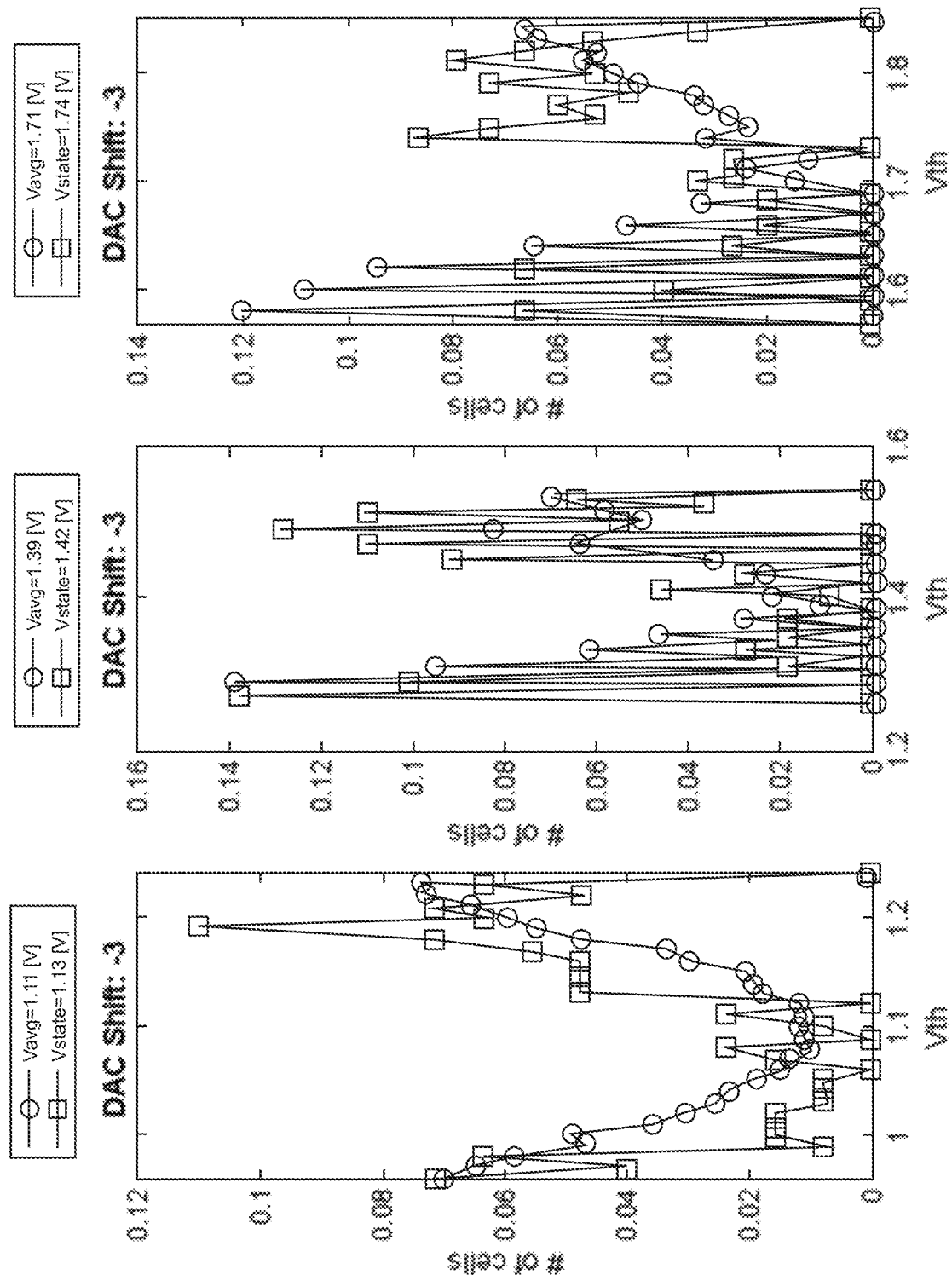
Figure 11C:
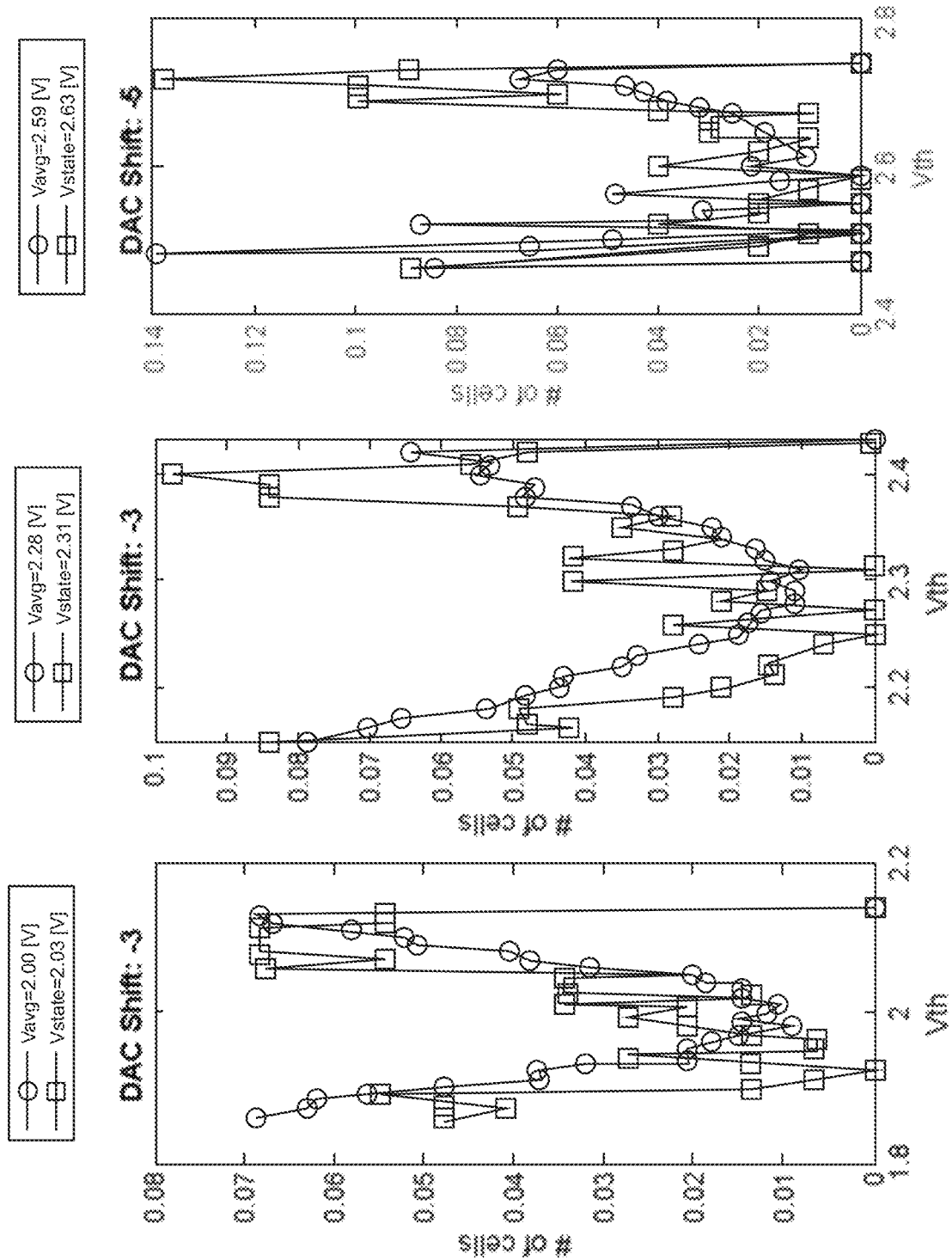
Figure 11D:
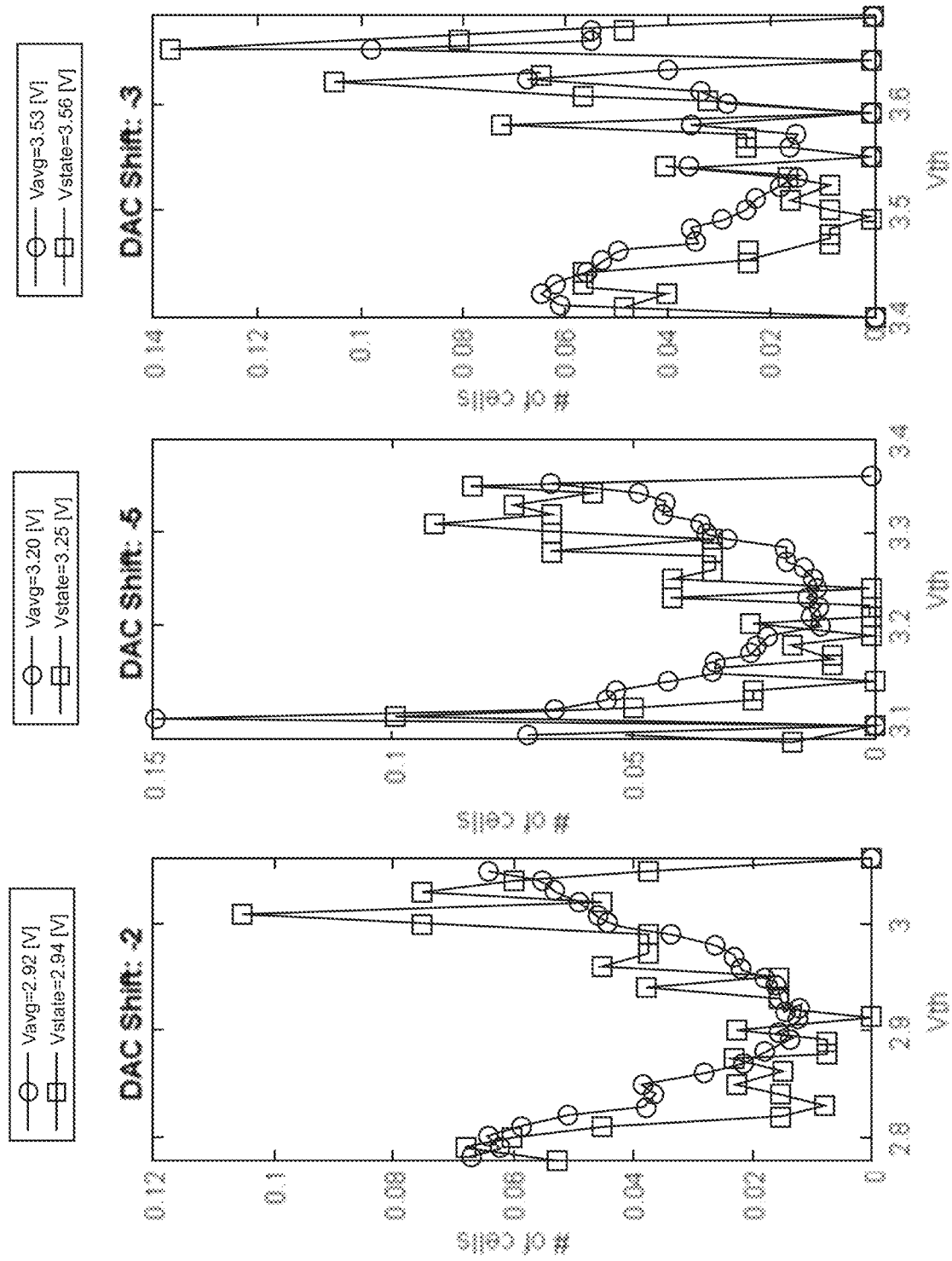
Figure 11E:
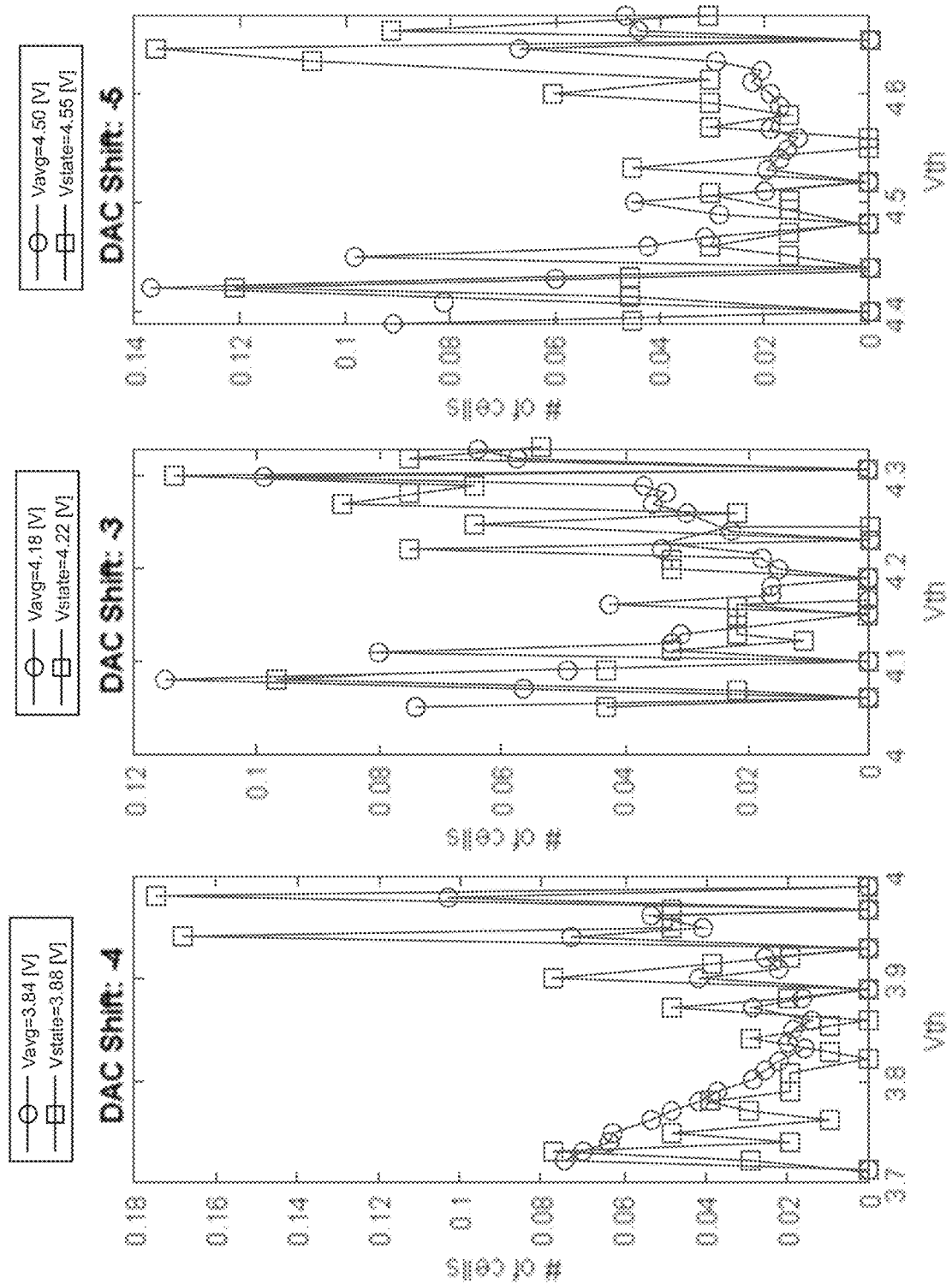
Figure 12A:
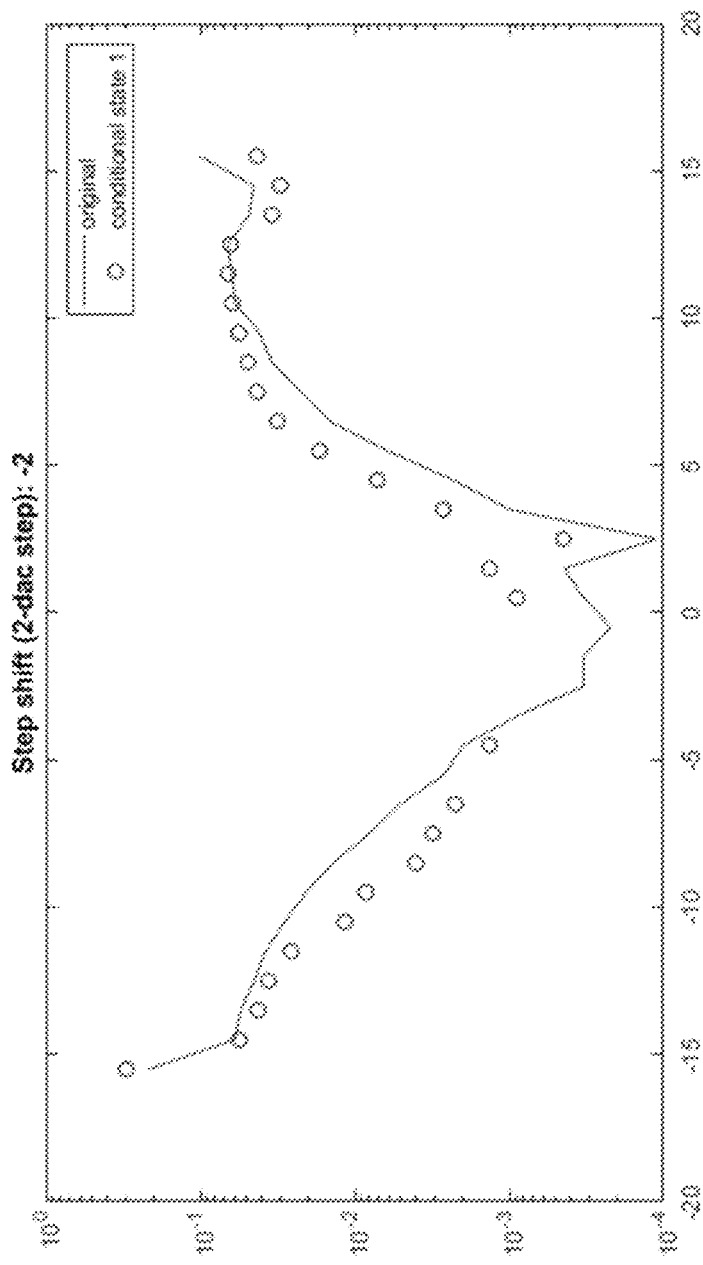
FIGS. 12A, 12B, 12C, and 12D are diagrams illustrating a histogram vector of soft samples obtained from N read operations around a given threshold and conditional histograms for k-th ICI states, according to various arrangements.
Figure 12B:
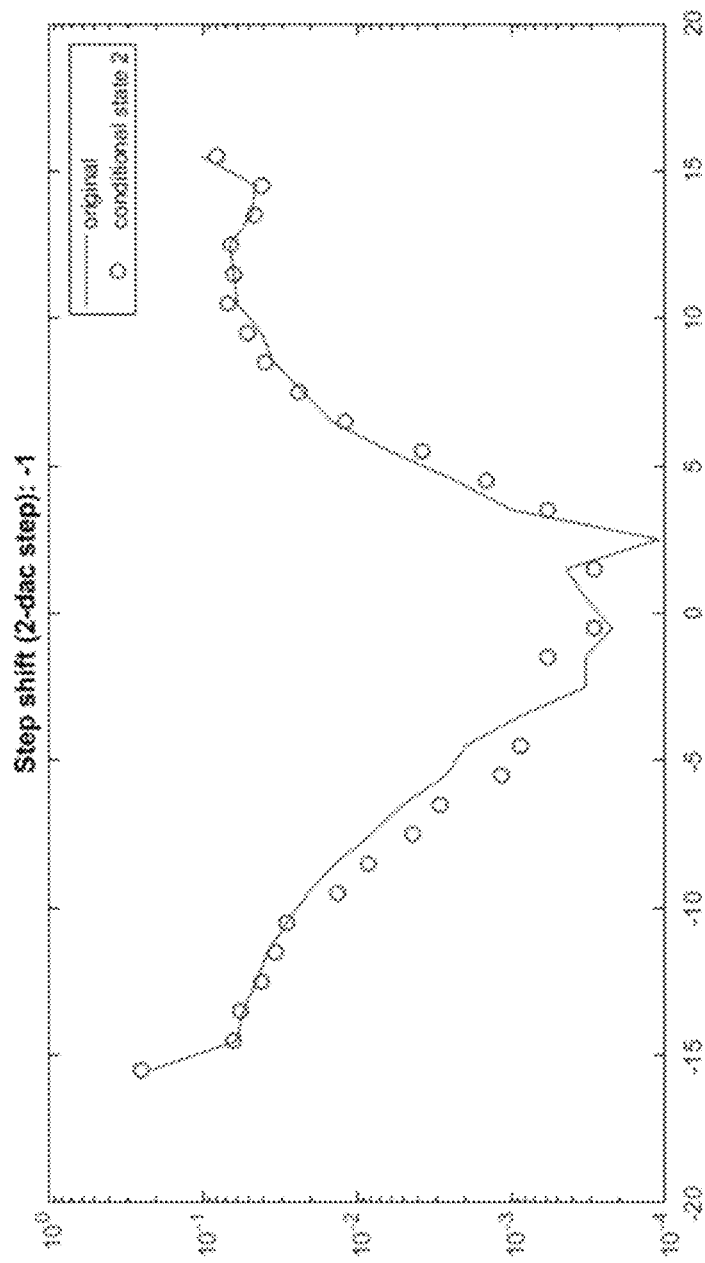
Figure 12C:
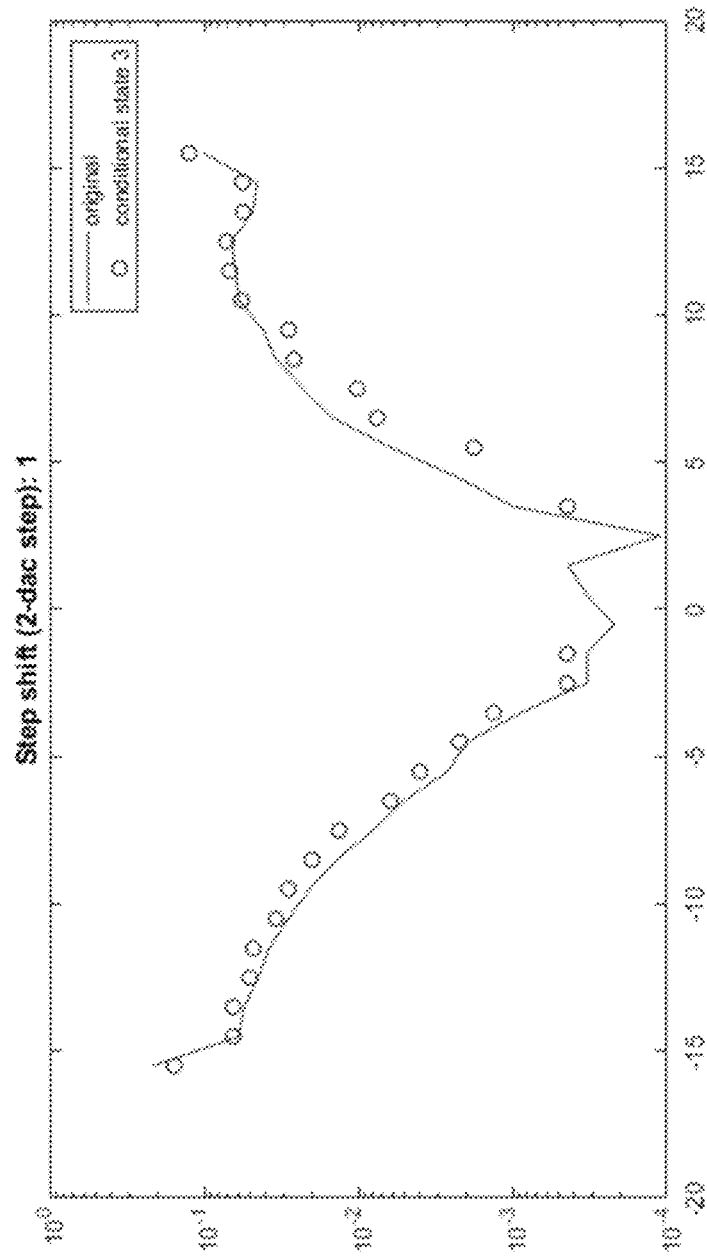
Figure 12D:
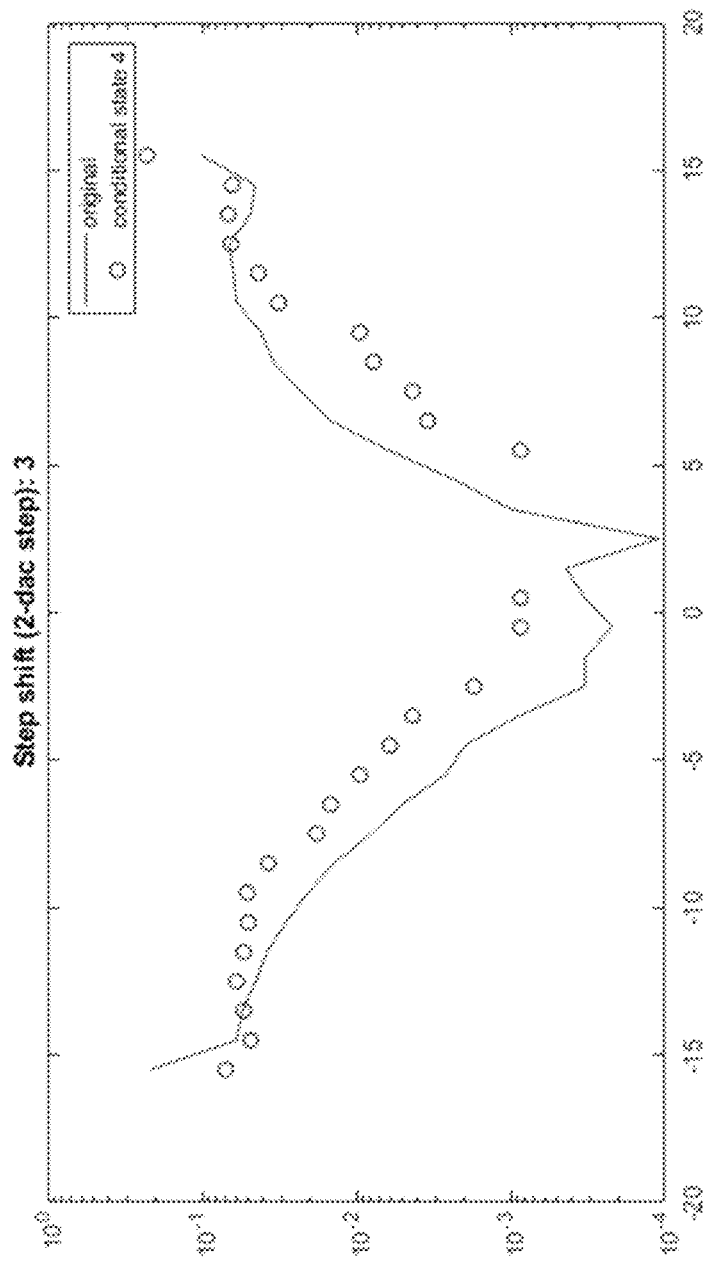

FIG. 10 is a conditional histogram 1000 of k-th ICI state, according to various arrangements. The shift for ICI compensation $I_k$ 1040 can be determined, for example, using Expression (12). As shown, the ICI compensation $I_k$ for this particular ICI state is 10 steps. A step size for ICI compensation corresponds to the DAC step during soft sampling for histogram computation. The threshold 1010 is the optimal threshold in the no ICI case, which may be slightly different from the QT threshold 1020. The threshold 1030 is the optimal threshold considering ICI compensation $I_k$ 1040.

FIGS. 11A, 11B, 11C, 11D, and 11E are diagrams illustrating conditional histograms for all 15 thresholds of a QLC device and for the k-th ICI state, according to various arrangements. The shift for ICI compensation $I_k$ can be determined, for example, using Expression (12). Following computation of $I_k$, the shift compensation for this ICI state is different for every threshold. The shift compensation in DAC steps for each graph is shown on the top of each graph. The histogram sampling step in this example is 1, and therefore the computed $I_k$ provides the required DAC shift compensation for the k-th ICI state.

In some TLC devices, the bias terms may be noisy. To address such issues, in some arrangements, the DAC ICI shift compensation is computed by using the heights of the histogram edge bins. For example, an ICI3 TLC setup where 3 SLC reads are applied on the next row WL(n+1) induces 4 ICI states. Example ICI threshold shifts in this case relative to the original input threshold are ordered as follows: ICI state 1 (strong negative shift), ICI state 2 (weak negative shift), ICI state 3 (weak positive shift), and ICI state 4 (strong positive shift). After normalizing the label histogram and conditional label histograms of each ICI state, in the case of negative shift, the height of the ICI left edge bin is higher than the height of the no-ICI left edge bin, while the height of the ICI right edge bin is lower than the height of the no-ICI right edge bin. Similarly, in the case of positive shift, the height of the ICI left edge bin is lower than the height of the no-ICI left edge bin, while the height of the ICI right edge bin is higher than the height of the no ICI right edge bin. Consequently, the edge bins height ratio is indicative for estimating the ICI compensation shift. Accordingly, in some arrangements, the ICI compensation shift can be estimated using the average of the edge bin height ratios.

Specifically, in some examples, for each ICI state, the no-ICI left edge bin height (LB), no-ICI right edge bin height (RB), ICI left edge bin height (LB_ICI), and ICI right edge bin height (RB_ICI) can be determined in the histogram for that ICI state. Then, for each ICI state, the ICI compensation shift can be estimated according to the following expressions:

$$\text{State 1:} -\text{ceil}\left(\frac{\left(\frac{\text{LB\_ICI}}{\text{LB}}\right)+\left(\frac{RB}{\text{RB\_ICI}}\right)}{2}\right); \tag{13}$$

$$\text{State 2:} -\text{floor}\left(\frac{\left(\frac{\text{LB\_ICI}}{\text{LB}}\right)+\left(\frac{RB}{\text{RB\_ICI}}\right)}{2}\right); \tag{14}$$

$$\text{State 3: floor}\left(\frac{\left(\frac{LB}{\text{LB\_ICI}}\right)+\left(\frac{\text{RB\_ICI}}{RB}\right)}{2}\right); \text{ and} \tag{15}$$

$$\text{State 4: ceil}\left(\frac{\left(\frac{LB}{\text{LB\_ICI}}\right)+\left(\frac{\text{RB\_ICI}}{RB}\right)}{2}\right). \tag{16}$$

The operators ceil(·) and floor(·) determine the ceiling and floor values of a real positive number, respectively.

FIGS. 12A, 12B, 12C, and 12D are diagrams illustrating a histogram vector of soft samples obtained from N read operations (e.g., $h_{N\times1}$) around a given threshold and conditional histograms for k-th ICI states (e.g., $h_{N\times1}^k$) for conditional states k=1, ..., 4, according to various arrangements. The threshold used for FIGS. 12A-12D is threshold 3 of the seven TLC read thresholds. The TLC histogram sampling step in FIGS. 12A-12D corresponds to 2 DAC steps. The ICI compensation shifts (in units of 2-DAC steps) are computed using the Expressions (13), (14), (15), and (16). The calculated ICI compensation shift for conditional state k=1 is −2 2-DAC steps in FIG. 12A, deemed to be a high negative shift. The calculated ICI compensation shift for conditional state k=2 is −1 2-DAC steps in FIG. 12B, deemed to be a low negative shift. The calculated ICI compensation shift for conditional state k=3 is 1 2-DAC steps in FIG. 12C, deemed to be a low positive shift. The calculated ICI compensation shift for conditional state k=4 is 3 2-DAC steps in FIG. 12D, deemed to be a high positive shift. It can be seen that the estimated ICI compensation shifts shown in FIGS. 12A-12D behave as expected from the physical properties of the ICI states. That is, the extrapolated line graph for each of the conditional histograms shifts to the left (in the negative direction) with respect to the original histogram vector of soft samples in FIGS. 12A and 12B by the corresponding shift amounts, while the extrapolated line graph for each of the conditional histograms shifts to the right (in the positive direction) with respect to the original histogram vector of soft samples in FIGS. 12C and 12D by the corresponding shift amounts.

In some arrangements, the $I_k$ compensation shift can computed by performing threshold tracking for searching the threshold which minimizes the BER for a given k-th ICI state. Examples of such threshold tracking include Pre-Soft Tracking (PST) as described in U.S. application Ser. No. 17/406,929, titled "SYSTEM AND METHOD FOR DYNAMIC INTER-CELL INTERFERENCE COMPENSATION IN NON-VOLATILE MEMORY STORAGE DEVICES," filed on Aug. 19, 2021 by Avi Steiner, Hanan Weingarten, Yasuhiko Kurosawa, and U.S. application Ser. No. 17/407,096, titled "SYSTEM AND METHOD FOR DYNAMIC COMPENSATION FOR MULTIPLE INTERFERENCE SOURCES IN NON-VOLATILE MEMORY STORAGE DEVICES," filed on Aug. 19, 2021, by Avi Steiner, Hanan Weingarten, Yasuhiko Kurosawa, which are both incorporated by reference herein in their entireties. In some examples, another example of threshold tracking algorithm is min-search, which searches for the threshold corresponding to minimal value of the histogram $h_{N\times 1}^k$.

In some arrangements, for multiple ICI states and given an offline optimized ordered non-uniform grid mapping for the ICI states, a model function can be optimized to parametrically describe the ICI compensation shift as function of the ICI state. It is noted here that an ICI state may be one ICI state or correspond to a group of multiple ICI states, as specified in a clustering algorithm as described herein. In some examples, n-th degree polynomial can describe the compensation shift function, and the dynamic estimation process estimates the polynomial coefficients per threshold/row/stress condition. An example of the n-th degree polynomial is Expression (5).

In some arrangements, a set of pre-computed model functions are prepared by offline optimization. Every pre-computed model function corresponds to a different stress condition. Each stress condition is associated with different interference impact. The set of pre-computed model functions is denoted as $\{f_s(x)\}_{s=0}^L$, where x is the ICI state x-axis grid value and L is the number of distinct stress conditions for which the compensation shift is modeled as a function of the ICI state. The pre-computed functions can be used to efficiently estimate the required ICI compensation. This can be done using various methods for a K ICI states input.

In one example (Method A), $I_k$ is determined for k=1 and for k=K. Then, s for which $f_s(x_1)$ and $f_s(x_K)$ are closest in MMSE to $I_k$ is determined for k=1 and for k=K, e.g., using Expression (17):

$$f_s = \arg\min_s |f_s(x_1) - I_1|^2 + |f_s(x_K) - I_K|^2 \qquad (17).$$

In other words, the predicted outcome $I_k$ of the selected model function for the highest and lowest ICI states is closest to the computed $I_k$ for the highest and lowest ICI states.

In another example (Method B), $I_k$ is determined for k=1, 2, ..., K. Then, s is selected for which $f_s(x)$ is closest in MMSE, e.g., using Expression (18):

$$f_s = \arg\min_s \Sigma_{k=1}^K |f_s(x_k) - I_k|^2 \qquad (18).$$

In other words, the predicted outcome $I_k$ of the selected model function for all ICI states or represented states is closest to the computed $I_k$ for all ICI states or represented states.

The pre-computed set of model functions can reduce computational complexity of the implementation while not compromising compensation accuracy. With regard to Method A, computing $I_k$ only for k=1 and for k=K further reduces computational complexity (e.g., as compared to Method B) for cases in which K is large. Threshold tracking (e.g., PST) for each $I_k$ may have significant computational latency, thus by computing only two extreme points (e.g., k=1 and k=K), a model function $f_s$ can be matched to achieve near optimal compensation. In some cases, to achieve sufficient accuracy, the average of all normalized histograms is computed, which means all $\{I_k\}_{k=1}^K$ are estimated dynamically. Once all estimated compensation values $\{I_k\}_{k=1}^K$ become available, model function can be selected using Method B. In some examples, the model function $f_s(x)$ can be a low-order polynomial. In some examples, a linear curve mapping of the ICI states to corresponding compensation shifts is performed.

Figure 13:
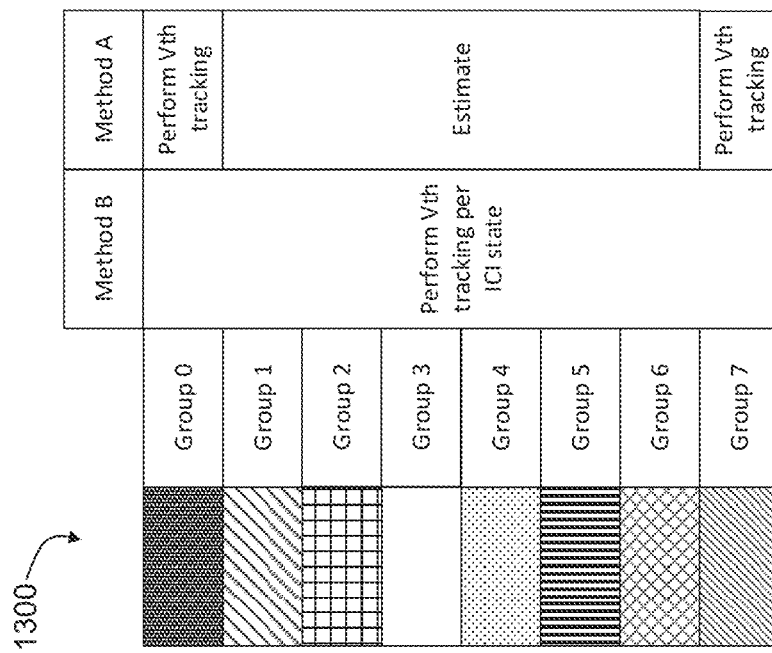
FIG. 13 is a diagram illustrating methods for estimating ICI compensation shift, according to some arrangements.

FIG. 13 is a diagram 1300 illustrating two methods (Method A and Method B) for estimating ICI compensation shift, according to some arrangements. In the diagram 1300, ICI states 801-808 (shading corresponding to that of FIG. 8) are clustered into eight groups or clusters (e.g., K=8). Specifically, ICI states 801 are clustered in Group 0 (represented by representative ICI state 801). ICI states 802 are clustered in Group 1 (represented by representative ICI state 802). ICI states 803 are clustered in Group 2 (represented by representative ICI state 803). ICI states 804 are clustered in Group 3 (represented by representative ICI state 804). ICI states 805 are clustered in Group 4 (represented by representative ICI state 805). ICI states 806 are clustered in Group 5 (represented by representative ICI state 806). ICI states 807 are clustered in Group 6 (represented by representative ICI state 807). ICI states 808 are clustered in Group 7 (represented by representative ICI state 808). While each group shown in the diagram 1300 includes multiple ICI states as shown in FIG. 8, in other examples, each group in the diagram 1300 includes only one ICI state. With respect to Method A, threshold (Vth) tracking is performed for k=1 (e.g., Group 0, ICI states 801) and for k=K (e.g., Group 7, ICI states 808) to determine corresponding $I_k$. The $I_k$ for the rest of the groups (e.g., Group 1-Group 6) is thus estimated. With respect to Method B, threshold tracking is performed for k=1, 2, ..., K (e.g., Group 0–Group 7) to determine corresponding $I_k$.

Figure 14:
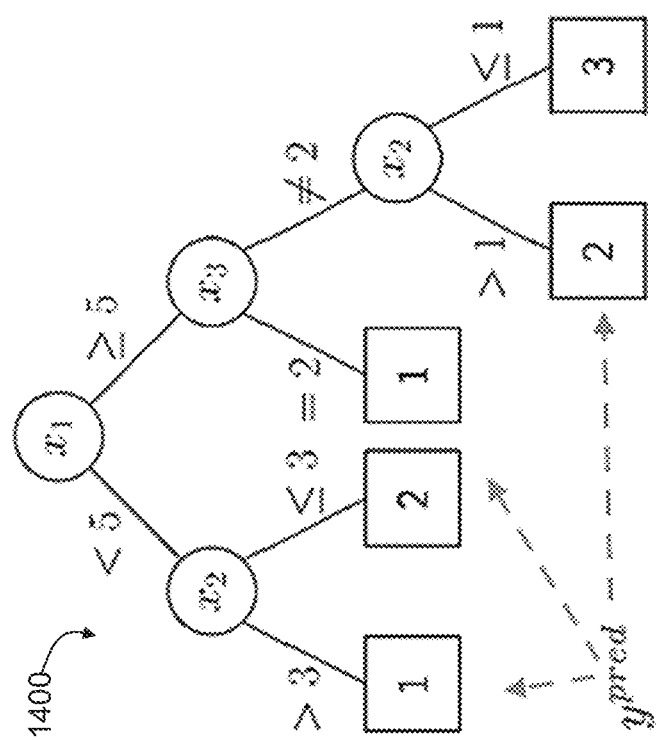
FIG. 14 is a diagram illustrating a decision tree used to select a model function, according to various arrangements.

In some arrangements, the selection of the model function, $f_s$, can be implemented by training a decision tree. The input features to the decision tree include for example the available estimated shifts for each ICI state ($\{I_k\}_{k=1}^K$), and the output from the decision tree includes the chosen model function yielding the corresponding ICI shifts to be deployed. Decision rules can be based on intervals containing (or not containing) the ICI compensation shifts and distances between the different ICI compensation shifts. FIG. 14 is a diagram illustrating a decision tree 1400 used to select a model function, according to various arrangements. As described, $x_i$ is the x-axis grid value for the i-th ICI sate. In the decision tree 1400, it is determined whether the estimated ICI compensation shift at $x_1$ is less than 5 or greater than or equal to 5. If less than 5, it is determined whether the estimated ICI compensation shift at $x_2$ is greater than 3 or less than or equal to 3. If greater than 3, the model function $f_s$ is model function 1. If less than or equal to 3, the model function $f_s$ is model function 2. If greater than or equal to 5, it is determined whether the estimated ICI compensation shift at $x_3$ equals to 2 or not. If equals to 2, the model function $f_s$ is model function 1. If does not equal to 2, it is determined whether the estimated ICI compensation shift at $x_2$ is greater than 1 or less than or equal to 1. If greater than 1, the model function $f_s$ is model function 2. If less than or equal to 1, the model function $f_s$ is model function 3.

Figure 15:
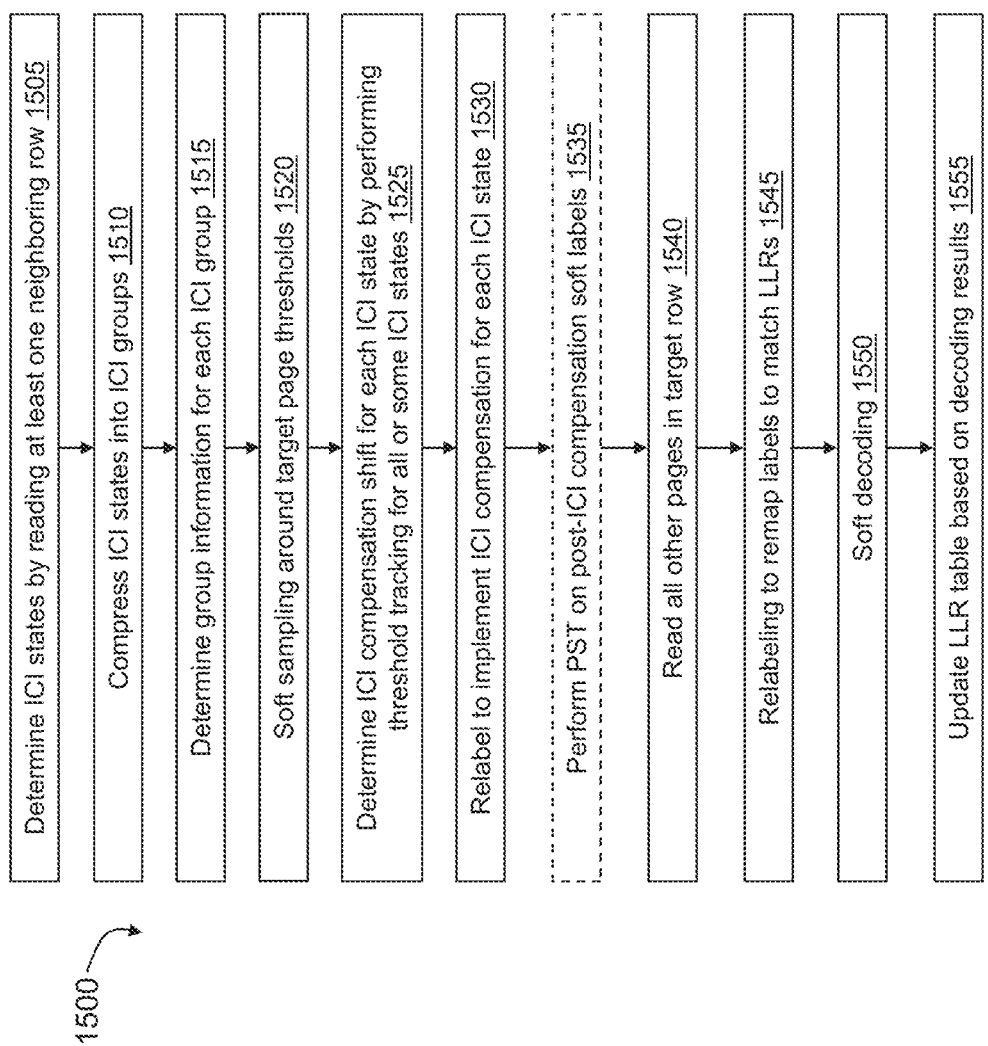
FIG. 15 is a flowchart of a read flow using dynamic ICI compensation for multiple ICI read operations, according to some arrangements.

FIG. 15 is a flowchart of a read flow 1500 using dynamic ICI compensation for multiple ICI read operations, according to some arrangements. The read flow 1500 is a QLC Soft Bit (SB) decoding read flow. The read flow 1500 performs dynamic ICI compensation for multiple ICI states with threshold tracking on a subset or all ICI states. The read operation seeks to read data from a target page of a target row.

At 1505, at least one neighboring row is read. Each of the at least one neighboring row neighbors the target row. The at least one neighboring row correspond to the interference sources for the target row. In some arrangements, multiple full page reads can be performed on each of the at least one neighboring row. For example, 4 full page read operations may be performed on each of two neighboring rows, including a previous row (e.g., WL(n−1)) and a next row (e.g., WL(n+1)). Therefore, 8 total full page read operations are performed. A number of possible ICI states (e.g., 256 ICI states for the 8 total full page read operations) can be obtained as the result of 1505. In some examples, every cell in the target row is associated with one of the obtained possible ICI states (e.g., out of 256 ICI states).

At 1510, the ICI states obtained at 1505 are compressed into ICI groups. For example, similar ICI states can be grouped into a same ICI group or cluster. Each group is represented by a single ICI state referred to as a representative ICI state, as described herein. That is, multiple similar ICI states obtained at 1505 can be grouped into a same group and represented by a single representative ICI state. In the example in which 256 ICI states are obtained at 1505, those ICI states can be compressed into 16 target ICI groups. In other words, every input ICI state is associated with or mapped to one of the 16 target states. The mapping can be performed using a labeling operation. For example, every 8-bit input ICI state (to identify one of 256 total ICI states, for example) can be modified to a 4-bit output ICI state (to identify one of 16 states). In some examples, the groups or clusters may not be equal in sizes as the clustering is performed via k-means (where k=16, for example). In other examples, the groups or clusters may have the same sizes. Accordingly, after compressing the ICI states into ICI groups or clusters, the information for the compressed 16 representative ICI states can be saved to 4-input buffers, and the 8-input buffers storing the 256 ICI states can be discarded. In other arrangements, the ICI states are not grouped, which is equivalent to the number of ICI states within an ICI group being one.

In some examples, the ICI states (not grouped) or the representative ICI states may be ordered in the manner described herein. In some examples, the ICI states or representative ICI states can be ordered from the lowest interference impact (e.g., lowest interference shift in either the positive or the negative direction) to the highest interference impact, vice versa. In other examples, the ICI states or representative ICI states can be ordered from the large negative shift, small negative shift, small positive shift, and large positive shift, vice versa. The ICI states (not grouped) or the representative ICI states can be ordered from the first or lowest ICI state (e.g., k=1) to the last or highest ICI state (e.g., k=K).

At 1515, group information for each ICI group is determined. The group information can be acquired by additional single-state reads. The group information reads can distinguish between cells around each target threshold. For example, three SLC reads can be performed to separate lobe regions of the histograms around each threshold of the target page of the target row. For QLC, the number of required separators is usually 3, as for one page type only 2 separators are needed. The group information associates the target cell with a specific read threshold and lobes region.

At 1520, soft sampling around the target page thresholds is performed. In some examples, the soft sampling can be performed with coherent combining. In some examples, 31 reads are performed for the soft sampling. The read operations can be performed using a 1-DAC-step spacing in QLC or 2-DAC-step in TLC.

At 1525, the ICI compensation shift is determined (e.g., estimated) for each ICI state by performing threshold tracking (e.g., PST) for all ICI states or representative states or for some but not all of the ICI states or representative states.

In some examples, the ICI compensation shifts for all ICI states or representative states can be determined using Method A. For example, the threshold tracking (e.g., PST) can be performed on a first ICI state or representative ICI state such as the lowest ICI state or representative ICI state (e.g., k=1) and a second ICI state or representative ICI state such as the highest ICI state or representative ICI state (e.g., k=K) to determine the ICI compensation shift for those two extreme ICI states or representative states, instead of performing threshold tacking for all ICI states. The optimal threshold is found for those two extreme ICI states, from which the ICI compensation shifts can be determined. Using Expression (17), a model function from the model function set can be selected by determining that the selected model function best fits the ICI compensation shifts of the two extreme ICI states. Alternatively, the model function parameters (e.g., the coefficients in Expression (5)) can be estimated based on the ICI compensation shifts of the two extreme ICI states. While two extreme ICI states are used in Method A, it should be understood that two or more ICI states selecting using other criteria (e.g., regular intervals of a predetermined number of ICI states in the ordered ICI state) can be used.

In some examples, the ICI compensation shifts for all ICI states or representative states can be determined using Method B. For example, the threshold tracking (e.g., PST) can be performed on every ICI state determined at 1505 and target threshold. The optimal threshold is determined for each ICI state, and the optimal threshold can be used to determine the corresponding ICI compensation shift for each ICI state. Using Expression (18), a model function from the model function set can be selected by determining that the selected model function best fits the ICI compensation shifts of all computed ICI states. Alternatively, the model function parameters (e.g., the coefficients in Expression (5)) can be estimated based on the ICI compensation shifts of all computed ICI states.

At 1530, a relabeling operation is performed to implement the ICI compensation shift for each ICI state or ICI representative state. SB labels can be used to compensate for ICI. By relabeling, the read voltage thresholds can be adjusted. For example, the estimated ICI compensation threshold may be relabeled to reflect updated (or optimal, improved, tracked) ICI compensation for a given ICI state.

At 1535, threshold tracking (e.g., PST) can be performed on post-ICI compensation soft labels for each threshold to determine optimal threshold following ICI compensation. In some examples, 1535 performed in response to determining that the accuracy of PST for one or more of the ICI state is below a predetermined minimal BER after ICI compensation at 1530.

At 1540, all pages (other than the target page) in the target row are read in order to map each bit to a specific lobe region. At 1545, a relabeling operation is performed to remap labels to match LLRs for the soft decoder. For example, each lobe region is relabeled according to its expected distribution and mapping to LLR. 6-bit labels for LLR LUT input can be determined as the result of the relabeling. At 1550, soft decoding with 6-bit input labels is performed. At 1555, dynamic LLR estimation (DLE) between decoding attempts can be employed to update LLR table based on the decoding results.

Figure 16:
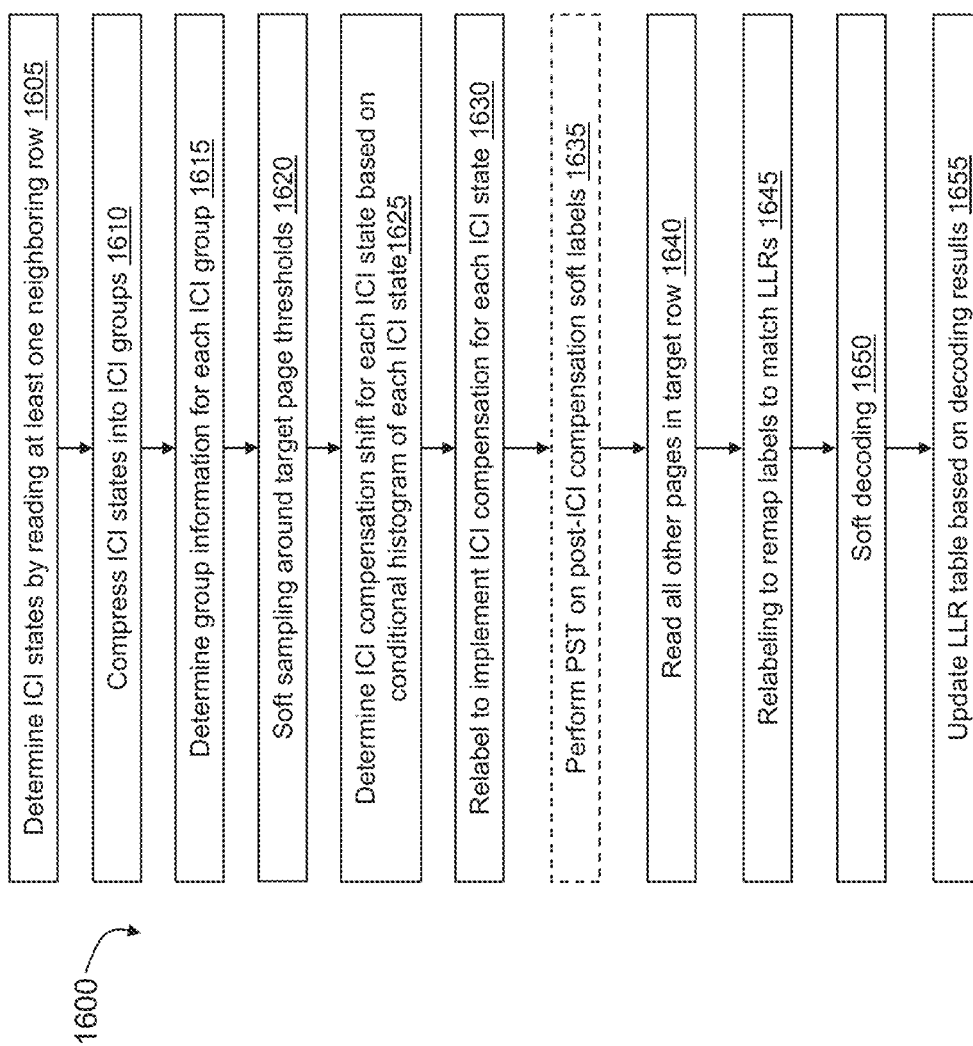
FIG. 16 is a flowchart of a read flow using dynamic ICI compensation for multiple ICI read operations with non-biased shift estimation on a subset or all ICI states, according to some arrangements.

FIG. 16 is a flowchart of a read flow 1600 using dynamic ICI compensation for multiple ICI read operations with non-biased shift estimation on a subset or all ICI states, according to some arrangements. The read flow 1600 is a QLC SB decoding read flow. The read flow 1500 performs dynamic ICI compensation for multiple ICI states with threshold tracking on a subset or all ICI states. The read operation seeks to read data from a target page of a target row.

At 1605, at least one neighboring row is read. Each of the at least one neighboring row that neighbors the target row. The at least one neighboring row correspond to the interference sources for the target row. In some arrangements, multiple full page reads can be performed on each of the at least one neighboring row. For example, 4 full page read operations may be performed on each of two neighboring rows, including a previous row (e.g., WL(n−1)) and a next row (e.g., WL(n+1)). Therefore, 8 total full page read operations are performed. A number of possible ICI states (e.g., 256 ICI states for the 8 total full page read operations) can be obtained as the result of 1605. In some examples, every cell in the target row is associated with one of the obtained possible ICI states (e.g., out of 256 ICI states).

At 1610, the ICI states obtained at 1605 are compressed into ICI groups. For example, similar ICI states can be grouped into a same ICI group or cluster. Each group is represented by a single ICI state referred to as a representative ICI state, as described herein. That is, multiple similar ICI states obtained at 1605 can be grouped into a same group and represented by a single representative ICI state. In the example in which 256 ICI states are obtained at 1605, those ICI states can be compressed into 8 target ICI groups. In other words, every input ICI state is associated with or mapped to one of the 8 target states. The mapping can be performed using a labeling operation. For example, every 8-bit input ICI state (to identify one of 256 total ICI states, for example) can be modified to a 3-bit output ICI state (to identify one of 8 states). In some examples, the groups or clusters may not be equal in sizes as the clustering is performed via k-means (where k=8, for example). In other examples, the groups or clusters may have the same sizes. Accordingly, after compressing the ICI states into ICI groups or clusters, the information for the compressed 8 representative ICI states can be saved to 3-input buffers, and the 8-input buffers storing the 256 ICI states can be discarded. In other arrangements, the ICI states are not grouped, which is equivalent to the number of ICI states within an ICI group being one.

At 1615, group information for each ICI group is determined. The group information can be acquired by additional single-state reads. The group information reads can distinguish between cells around each target threshold. For example, three SLC reads can be performed to separate lobe regions of the histograms around each threshold of the target page of the target row. For QLC, the number of required separators is usually 3, as for one page type only 2 separators are needed. The group information associates the target cell with a specific read threshold and lobes region.

At 1620, soft sampling around the target page thresholds is performed. In some examples, the soft sampling can be performed with coherent combining. In some examples, 31 reads are performed for the soft sampling. The read operations can be performed using a 1-DAC-step spacing in QLC or 2-DAC-step in TLC.

At 1625, the ICI compensation shift is determined (e.g., estimated) for each ICI state based on every conditional histogram of each ICI state.

In some examples, the ICI compensation shift for each ICI state can be estimated by determining the average non-biased shift for every condition histogram for each ICI state and threshold group. As described, the non-biased ICI compensation shift for a conditional histogram (e.g., the conditional histogram 1000) with edge bin reduction can be determined using Expression (12). In some arrangements, model function fitting can be performed to obtain robust estimation for each ICI compensation shift. For example, using Expression (18) which is likewise applicable here, a model function from the model function set can be selected by determining that the selected model function best fits the ICI compensation shifts of all computed ICI states determined using the average non-biased shift for every conditional histogram of each ICI state and threshold group. Alternatively, the model function parameters (e.g., the coefficients in Expression (5)) can be estimated based on the ICI compensation shifts of all computed ICI states determined using the average non-biased shift for every conditional histogram of each ICI state and threshold group.

In some examples, the ICI compensation shift for each ICI state can be estimated by determining the edge bins height ratio for each ICI state and threshold group. As described, the edge bins height ratio is the ratio between the height of a normalized soft samples histogram edge bins and the height of a normalized conditional soft samples histogram edge bins for a given ICI state.

At 1630, a relabeling operation is performed to implement the ICI compensation shift for each ICI state or ICI representative state. SB labels can be used to compensate for ICI. By relabeling, the read voltage thresholds can be adjusted. For example, the estimated ICI compensation threshold may be relabeled to reflect updated (or optimal, improved, tracked) ICI compensation for a given ICI state.

At 1635, threshold tracking (e.g., PST) can be performed on post-ICI compensation soft labels for each threshold to determine optimal threshold following ICI compensation. In some examples, 1635 performed in response to determining that the accuracy of PST for one or more of the ICI state is below a predetermined minimal BER after ICI compensation at 1630.

At 1640, all pages (other than the target page) in the target row are read in order to map each bit to a specific lobe region. At 1645, a relabeling operation is performed to remap labels to match LLRs for the soft decoder. For example, each lobe region is relabeled according to its expected distribution and mapping to LLR. 6-bit labels for LLR LUT input can be determined as the result of the relabeling. At 1650, soft decoding with 6-bit input labels is performed. At 1655, DLE between decoding attempts can be employed to update LLR table based on the decoding results.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method, comprising:
    determining a plurality of interference states with respect to an interference source of a target row of a non-volatile memory to be read;
    determining compensation shifts for the plurality of interference states by determining a compensation shift for each of two or more interference states of the plurality of interference states, wherein at least one of the compensation shifts is determined by extrapolating from another one of the compensation shifts; and
    applying the compensation shifts for the plurality of interference states to reading the target row.

2. The method of claim 1, wherein
    the interference source comprises at least one neighboring row that neighbors the target row; and determining the plurality of interference states comprises reading the at least one neighboring row.

3. The method of claim 1, wherein the compensation shift for each of the two or more interference states is determined using threshold tracking.

4. The method of claim 1, wherein
the two or more interference states comprise a first interference state and a second interference state; and
determining the compensation shift for each of the two or more interference states comprises determining a first compensation shift for the first interference state and determining a second compensation shift for the second interference state.

5. The method of claim 4, wherein
the plurality of interference states are ordered according to interference impact of each of the plurality of interference states to the target row;
the first interference state has lowest interference impact to the target row; and
the second interference state has highest interference impact to the target row.

6. The method of claim 4, further comprising selecting a model function from a set of model functions based on the first compensation shift and the second compensation shift.

7. The method of claim 6, wherein the model function is selected based on predicted outcome of the model function being closest to the first compensation shift and the second compensation shift than predicted outcomes of other model functions in the set of model functions.

8. The method of claim 1, wherein
the two or more interference states comprise a subset of all of the plurality of interference states; and
determining the compensation shift for each of the two or more interference states comprises directly determining a compensation shift for each of the two or more interference states without extrapolating from other compensation shifts.

9. The method of claim 8, further comprising selecting a model function from a set of model functions based on the compensation shift for each of the plurality of interference states.

10. The method of claim 9, wherein the model function is selected based on predicted outcome of the model function being closest to the compensation shift for each of the plurality of interference states than predicted outcomes of other model functions in the set of model functions.

11. The method of claim 8, wherein determining the compensation shift for each of the two or more interference states comprises determining an average non-biased shift for every condition histogram for each of the plurality of interference states.

12. The method of claim 11, further comprising selecting a model function from a set of model functions based on the compensation shift for each of the two or more interference states.

13. The method of claim 8, wherein determining the compensation shift for each of the two or more interference states comprises determining a ratio between a height of a normalized soft samples histogram edge bins and a height of a normalized conditional soft samples histogram edge bins for each of the plurality of interference states.

14. The method of claim 1, wherein each of the plurality of interference states is a representative interference state representing a plurality of interference states.

15. A system comprising:
a non-volatile memory comprising a target row and an interference source of the target row; and
a circuit configured to:
determine a plurality of interference states with respect to the interference source of the target row;
determine compensation shifts for the plurality of interference states by determining a compensation shift for each of two or more interference states of the plurality of interference states, wherein at least one of the compensation shifts is determined by extrapolating from another one of the compensation shifts; and
apply the compensation shifts for the plurality of interference states to reading the target row.

16. The system of claim 15, wherein
the two or more interference states comprise a first interference state and a second interference state; and
determining the compensation shift for each of the two or more interference states comprises determining a first compensation shift for the first interference state and determining a second compensation shift for the second interference state.

17. At least one non-transitory processor-readable medium containing processor-readable instructions, such that, when executed by one or more processors, causes the one or more processors to:
determine a plurality of interference states with respect to an interference source of a target row of a non-volatile memory to be read;
determine compensation shifts for the plurality of interference states by determining a compensation shift for each of two or more interference states of the plurality of interference states, wherein at least one of the compensation shifts is determined by extrapolating from another one of the compensation shifts; and
apply the compensation shifts for the plurality of interference states to reading the target row.

18. The non-transitory processor-readable medium of claim 17, wherein
the two or more interference states comprise a first interference state and a second interference state; and
determining the compensation shift for each of the two or more interference states comprises determining a first compensation shift for the first interference state and determining a second compensation shift for the second interference state.

19. The non-transitory processor-readable medium of claim 18, wherein
the plurality of interference states are ordered according to interference impact of each of the plurality of interference states to the target row;
the first interference state has lowest interference impact to the target row; and
the second interference state has highest interference impact to the target row.

20. The non-transitory processor-readable medium of claim 18, wherein the one or more processors are further caused to select a model function from a set of model functions based on the first compensation shift and the second compensation shift.

* * * * *